(12) United States Patent
Motoyoshi

(10) Patent No.: US 9,219,047 B2
(45) Date of Patent: Dec. 22, 2015

(54) STACKED DEVICE AND METHOD OF MANUFACTURING THE SAME

(71) Applicant: TOHOKU-MICROTEC CO., LTD, Aobaku-Sendai-shi, Miyagi (JP)

(72) Inventor: Makoto Motoyoshi, Sendai (JP)

(73) Assignee: TOHOKU-MICROTEC CO., LTD, Sendai-Shi (JP)

( * ) Notice: Subject to any disclaimer, the term of this patent is extended or adjusted under 35 U.S.C. 154(b) by 0 days.

(21) Appl. No.: 14/168,897

(22) Filed: Jan. 30, 2014

(65) Prior Publication Data

US 2014/0252604 A1  Sep. 11, 2014

Related U.S. Application Data

(63) Continuation of application No. PCT/JP2013/056330, filed on Mar. 7, 2013.

(51) Int. Cl.
*H01L 23/52* (2006.01)
*H01L 23/00* (2006.01)
(Continued)

(52) U.S. Cl.
CPC ............... *H01L 24/14* (2013.01); *H01L 23/147* (2013.01); *H01L 23/49816* (2013.01); *H01L 23/49827* (2013.01); *H01L 23/544* (2013.01); *H01L 24/11* (2013.01); *H01L 25/0655* (2013.01); *H01L 25/0657* (2013.01); *H01L 25/50* (2013.01); *H01L 2223/5442* (2013.01); *H01L 2223/54426* (2013.01); *H01L 2223/54473* (2013.01); *H01L 2223/54486* (2013.01); *H01L 2225/06513* (2013.01); *H01L 2225/06593* (2013.01); *H01L 2924/01322* (2013.01); *H01L 2924/15192* (2013.01)

(58) Field of Classification Search
CPC ........ H01L 23/522; H01L 24/11; H01L 24/14
USPC ........................................... 257/737; 438/121
See application file for complete search history.

(56) References Cited

U.S. PATENT DOCUMENTS

2008/0176362 A1* 7/2008 Sengupta et al. ............. 438/123
2010/0248424 A1* 9/2010 Luce et al. .................... 438/109
(Continued)

FOREIGN PATENT DOCUMENTS

| JP | 2000-252413 A | 9/2000 |
| JP | 2005-340738 A | 12/2005 |
| JP | 2008-021751 A | 1/2008 |

OTHER PUBLICATIONS

English translation for JP2008021751A.*
(Continued)

*Primary Examiner* — Christine Enad
(74) *Attorney, Agent, or Firm* — NDQ&M WATCHSTONE LLP

(57) ABSTRACT

A stacked device encompasses a lower chip including a plurality of wiring lands and a plurality of wall-block patterns, each of the wall-block patterns is allocated at a position except locations where the wiring lands are disposed, each of the wall-block patterns has a inclined plane, a height of each of the wall-block patterns measured from a reference plane of the array of the wiring lands is higher than the wiring lands, and an upper chip including a plurality of wiring bumps assigned correspondingly to the positions of the wiring lands, respectively, and a plurality of cone bumps assigned correspondingly to the positions of the wall-block patterns, respectively.

17 Claims, 23 Drawing Sheets

(51) Int. Cl.
  *H01L 23/14*    (2006.01)
  *H01L 23/498*   (2006.01)
  *H01L 23/544*   (2006.01)
  *H01L 25/065*   (2006.01)
  *H01L 25/00*    (2006.01)

(56) References Cited

U.S. PATENT DOCUMENTS

2011/0068481 A1* 3/2011 Park et al. .................... 257/777
2011/0215466 A1* 9/2011 Hsu et al. ..................... 257/737
2011/0275177 A1* 11/2011 Yim et al. ..................... 438/108
2012/0020040 A1* 1/2012 Lin et al. ...................... 361/772
2012/0098123 A1* 4/2012 Yu et al. ....................... 257/737

OTHER PUBLICATIONS

English language abstract of JP 2005-340738A, published Dec. 8, 2005.
English language abstract of JP 2008-021751A, published Jan. 31, 2008.
English language abstract of JP 2000-252413A, published Sep. 14, 2000.
International search report issued on Jun. 4, 2013, in parent application PCT/JP2013/056330.

* cited by examiner $\alpha_1 \geqq \alpha_2$ $\alpha 1 \geqq \alpha 2$ $\beta_1 \leqq \beta_2$ $\beta_1 \leqq \beta_2$

Fig. 19
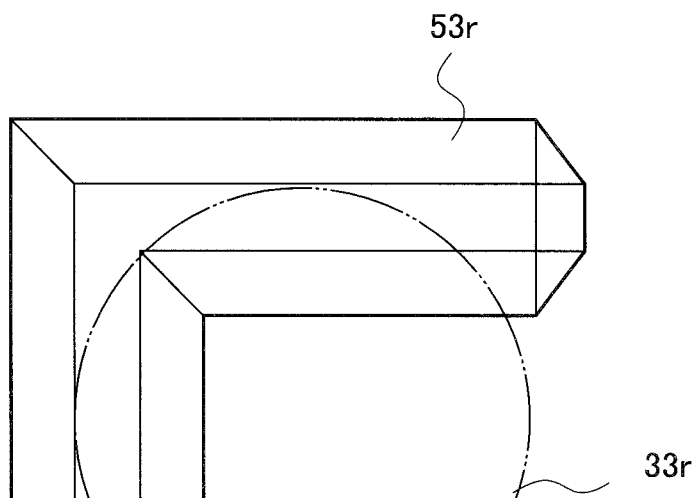
(a)
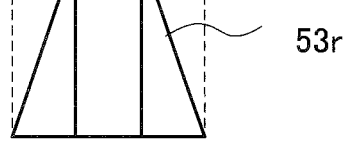
(b)

//  STACKED DEVICE AND METHOD OF MANUFACTURING THE SAME

CROSS REFERENCE TO RELATED APPLICATIONS

This is a continuation of International Application PCT/JP2013/056330, with an international filing date of Mar. 7, 2013, the entire contents of which are incorporated by reference herein.

BACKGROUND OF THE INVENTION

1. Field of the Invention

The present invention pertains to stacked devices of semiconductor integrated circuits (ICs), and more particularly relates to stacked devices such as three-dimensional (3D) integrated circuits in which semiconductor chips are stacked and the like, and a method of manufacturing the stacked devices.

2. Description of the Related Art

The integration degree of semiconductor integrated circuits continues to be promoted with the advance of a microprocessing technology. However, it is supposed that a limit of miniaturization will come in the finer and finer advance of the microprocessing technology. In association with the difficulty in the advance of the microprocessing technology, attention is paid to a 3D integrated circuit in which IC chips are stacked. Among the techniques for achieving the 3D integrated circuit, a technique for vertically stacking a plurality of IC chips, in each of the IC chips minute elements are delineated at chip level, is expected. However, when the upper level IC chip is stacked on the lower level IC chip, the upper and lower level IC chips are required to be precisely position-aligned. Thus, a throughput can not be made so high. Moreover, even if the upper and lower level IC chips are mechanically positioned, the alignment accuracy between the upper and lower level IC chips is about one micrometer at most. Hence, an alignment accuracy between the upper and lower level IC chips can not be made so high.

In view of such circumstances, a method of manufacturing a 3D integrated circuit is proposed. The proposed method includes a step of coating liquid on a plurality of temporally to-be-jointed areas, which are defined in a transfer-substrate respectively, so as to form a plurality of droplets of the liquid; a step of floating a plurality of IC chips on the plurality of droplets, which are separated for each of temporally to-be-jointed areas, and using the surface tension of the liquid, position-aligning each of the chips in each of the temporally to-be-jointed areas; and a step of vaporizing the droplets of the liquid, which are inserted between each of the IC chips and the temporally to-be-jointed areas, respectively, and temporally jointing each of the IC chips to the temporally to-be-jointed areas (please see JP 2010-225803A).

However, the above self-aligning method based on the surface tension of the liquid only, which is described in JP 2010-225803A, has a limit in the accuracy of alignment. Moreover, the self-aligning method has a problem such that a jointing process, after the upper level IC chip is stacked on the lower level IC chip, is complex and difficult.

Therefore, an object of the present invention is to provide a stacked device in which it is possible to easily achieve a high precision position-alignment with 0.2 micrometer accuracy or less, which extremely exceeds a precision of the self-alignment based on the surface tension of the liquid only, and it is simple to carry out the jointing process after the stacking process of the chips, and a method of manufacturing the stacked devices.

SUMMARY OF THE INVENTION

In order to achieve the above object, a first aspect of the present invention inheres in a stacked device encompassing (a) a lower chip including a plurality of wiring lands and a plurality of wall-block patterns, each of the wall-block patterns is allocated at a position except locations where the wiring lands are disposed, each of the wall-block patterns has a inclined plane, a height of each of the wall-block patterns measured from a reference plane of the array of the wiring lands is higher than the wiring lands, and (b) an upper chip including a plurality of wiring bumps assigned correspondingly to the positions of the wiring lands, respectively, and a plurality of cone bumps assigned correspondingly to the positions of the wall-block patterns, respectively.

A second aspect of the present invention inheres in a stacked device encompassing (a) an interposer including a plurality of wiring lands and a plurality of wall-block patterns, each of the wall-block patterns is allocated at a position except locations where the wiring lands are disposed, each of the wall-block patterns has a inclined plane, a height of each of the wall-block patterns measured from a reference plane of the array of the wiring lands is higher than the wiring lands, and (b) an IC chip including a plurality of wiring bumps assigned correspondingly to the positions of the wiring lands, respectively, and a plurality of cone bumps assigned correspondingly to the positions of the wall-block patterns, respectively.

A third aspect of the present invention inheres in a method of manufacturing a stacked device including (a) selectively coating a liquid onto a lower chip having a plurality of wiring lands and a plurality of wall-block patterns, which are arranged at positions except locations where the wiring lands are disposed, respectively, and each of the wall-block patterns has a inclined plane, respectively, (b) mating an upper chip having a plurality of wiring bumps assigned correspondingly to the positions of the wiring lands, respectively, and a plurality of cone bumps assigned correspondingly to the positions of the plurality of wall-block patterns, respectively, so that each of the wiring bumps faces to the plurality of the wiring lands, respectively, through a droplet of the coated liquid, (c) self-aligning the position of the plurality of wiring bumps to the positions of the wiring lands, respectively, and self-aligning the position of the plurality of cone bumps to the positions of the wall-block patterns, respectively through surface tension of the liquid, (d) applying a pressure so that the upper chip is pushed against the lower chip, and tips of the plurality of wiring bumps are brought into contact with the wiring lands in the self-aligned condition, respectively, and the plurality of cone bumps are brought into contact with the inclined planes of the plurality of wall-block patterns, respectively, and (e) vaporizing the liquid.

BRIEF DESCRIPTION OF THE DRAWINGS

FIG. 19(a) is a schematic view that explains another example of the structure of the wall-block pattern, and FIG. 19(b) is a side view taken from a front side in FIG. 19(a);

DETAILED DESCRIPTION OF THE INVENTION

Figure 1:
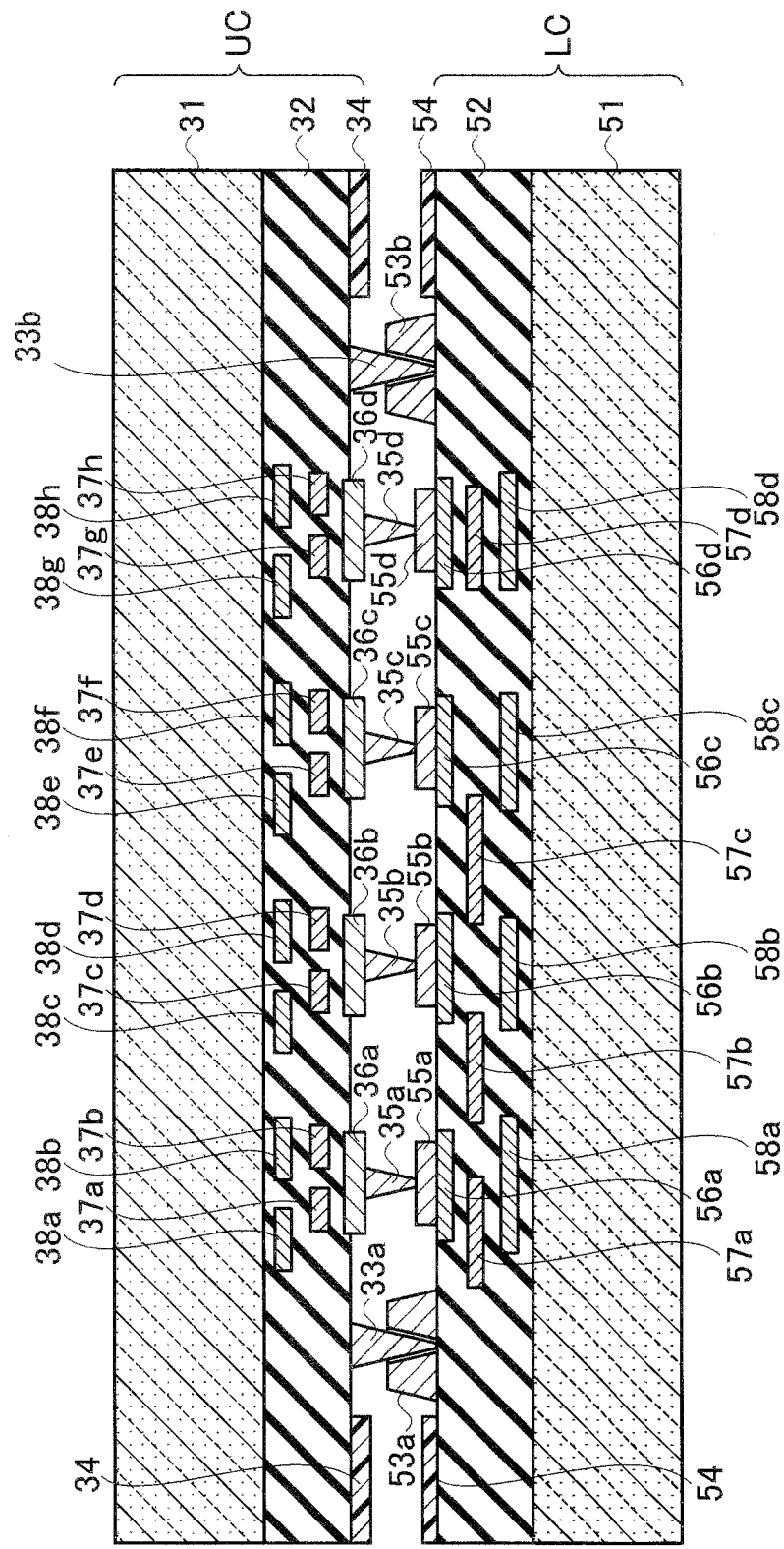
FIG. 1 is a schematic cross-sectional view explaining a rough outline of the main portion of a stacked device pertaining to a first embodiment of the present invention.

The first to third embodiments of the present invention will be described below with reference to the drawings. In the descriptions of the following drawings, the same or similar reference numerals are given to the same or similar portions. However, attention should be paid to a fact that, since the drawings are only schematic, a relation between a thickness and a planar dimension, and a ratio between the thicknesses of respective layers, and the like differ from the actual values. Thus, the specific thicknesses and dimensions should be judged by referring to the following explanations. Also, naturally, the portion in which the relation and ratio between the mutual dimensions are different is included even between the mutual drawings.

Also, because the following first to third embodiments are mere examples of the devices and methods to embody the technical idea of the present invention, in the technical idea of the present invention, the material quality, shape, structure, arrangement and the like of a configuration part are not limited to the followings. Therefore, various changes can be added to the technical idea of the present invention, within the technical scopes prescribed by claims.

First Embodiment

In a stacked device pertaining to a first embodiment of the present invention, as illustrated in FIG. 1, on a lower chip LC that is a semiconductor integrated circuit (IC), an upper chip UC, which has the similar configuration of the lower chip LC, is mounted. The lower chip LC has a plurality of wiring lands (electrical wiring lands) 55a, 55b, 55c and 55d and a plurality of wall-block patterns 53a, 53b which are arranged at positions outside the array of the plurality of wiring lands 55a, 55b, 55c and 55d, respectively. Here, each of the wiring lands 53a, 53b has inclined planes, respectively. On the other hand, the upper chip UC has a plurality of wiring bumps (electrical wiring bumps) 35a, 35b, 35c and 35d which are assigned correspondingly to the positions of the wiring lands 55a, 55b, 55c and 55d, respectively, and a plurality of cone bumps 33a, 33b which are assigned correspondingly to the positions of the plurality of wall-block patterns 53a, 53b, respectively. Each tip of the cone bumps 33a, 33b is thinner than each of the chip side of the cone bumps 33a, 33b. A height of the cone bumps 33a, 33b measured from a reference plane of the upper chip UC is equal or higher than a height of the wiring bumps 35a, 35b, 35c and 35d, measured from the same reference plane. In particular, the sum of a height of each of the wall-block patterns 53a, 53b measured from the reference plane of the array of the plurality of the wiring lands 55a, 55b, 55c and 55d and the height of the plurality of cone bumps 33a, 33b assigned correspondingly to the positions of the wall-block patterns 53a, 53b is higher than the sum of a height of the wiring lands 55a, 55b, 55c and 55d and the height of the wiring bumps 35a, 35b, 35c and 35d assigned correspondingly to the positions of the wiring lands 55a, 55b, 55c and 55d.

In addition, FIG. 1 exemplifies the case in which the wall-block patterns 53a, 53b are arranged at the positions outside the array of the wiring lands 55a, 55b, 55c and 55d, respectively. However, the arrangement of the wall-block patterns 53a, 53b is not limited to the configuration illustrated in FIG. 1. For example, in the stacked device pertaining to the first embodiment, at least one of the wall-block patterns 53a, 53b may exist in the inside of the array of the wiring lands 55a, 55b, 55c and 55d. That is, the wall-block patterns 53a, 53b may be arranged at the positions, respectively, except the locations at which the wiring lands 55a, 55b, 55c and 55d are arrayed.

When the stacked device in the first embodiment is explained in detail, in the lower chip LC, an inter-layer insulating film 52 is deposited on a semiconductor chip 51, as shown FIG. 1. Inside the inter-layer insulating film 52, lower level interconnections 58a, 58b, 58c and 58d made of metallic layer such as aluminum (Al), aluminum-copper alloy (Al—Cu alloy), or copper (Cu) damascene or the like, intermediate level interconnections 57a, 57b, 57c and 57d electrically connected through the inter-layer insulating film 52 on the lower level interconnections 58a, 58b, 58c and 58d, and upper level interconnections 56a, 56b, 56c and 56d electrically connected through the inter-layer insulating film 52 on those intermediate level interconnections 57a, 57b, 57c and 57d are buried. Thus, although the inter-layer insulating film 52 is represented as if it was a single layer film in a rough outlined simple representation illustrated in FIG. 1, the inter-layer insulating film 52 is actually the multilevel insulating layer implemented by triple or quadruple-level insulating layers. For the inter-layer insulating film 52 of the multilevel structure, for example, it is possible to use the inorganic-based insulating layer such as silicon dioxide film ($SiO_2$ film), silicon nitride film ($Si_3N_4$ film), phosphorous silicate glass film (PSG film), fluorine doped oxide film (SiOF film), carbon doped oxide film (SiOC film) and the like, and further, the organic-based insulating film such as hydrogenated silicon oxy-carbide (SiCOH), siloxane-based hydrogen silsesquioxane (HSQ), porous methyl silsesquioxane film, polyallylene, polyimide film and the like. Also, it is possible to combine and laminate those various insulating films and implement the inter-layer insulating film 52 of various multilevel interconnection structures.

FIG. 1 exemplifies the triple-level wiring layer for simplicity. Actually, the multilevel interconnection layer implemented by quadruple levels to twelve levels or thirteen levels or more is employed on the basis of a design-based requirement. Also, the lower level interconnections 58a, 58b, 58c and 58d, the intermediate level interconnections 57a, 57b, 57c and 57d, and the upper level interconnections 56a, 56b, 56c and 56d may not be implemented by a single-layer wiring made of the metals such as Al—Cu alloy and the like as mentioned above, and may be implemented by the laminated structure in which a barrier layer made of metals, such as titanium (Ti), tantalum (Ta), manganese (Mn), ruthenium (Ru) and the like, are formed in upper and lower levels. For example, the barrier layer made of TiN/Ti is formed in the upper and lower levels, and a quintuple-level laminated structure made of TiN/Ti/Al—Cu alloy/TiN/Ti and the like can be employed as the structure of the specific wiring layer in each of the lower level interconnections 58a, 58b, 58c and 58d, the intermediate level interconnections 57a, 57b, 57c and 57d and the upper level interconnections 56a, 56b, 56c and 56d.

When the explanation is carried out under assumption that the lower level interconnections 58a, 58b, 58c and 58d serve as the wiring layers of the first-level layer, each of the lower level interconnections 58a, 58b, 58c and 58d serving as the wiring layers of the first-level layer and an impurity-diffused regions formed in the inside (surface portion) of the semiconductor chip 51 are connected to each other through a via-plug (whose illustration is omitted) penetrating partially through a part of the inter-layer insulating film 52. When the lower level interconnections 58a, 58b, 58c and 58d are assigned as the wiring layers of the first level, the lower level interconnections 58a, 58b, 58c and 58d may be composite-structure implemented by an impurity-doped polycrystalline-silicon layer and a silicide film of the polycrystalline-silicon layer with refractory metal such as tantalum (Ta), titanium (Ti), tungsten (W) or vanadium (V) or the like. The via-plug (contact plug) may be made of refractory metals such as Ta, Ti, W, V and the like. For example, when the via-plug is made of W, the barrier layer made of TiN/Ti and the like may be formed on the side wall of the via-hole (contact hole) in which the via-plug is formed and the surface of the impurity-diffused regions of the semiconductor chip 51. Similarly, each of the intermediate level interconnections 57a, 57b, 57c and 57d and each of the corresponding lower level interconnections 58a, 58b, 58c and 58d are connected to each other through the via-plug (whose illustration is omitted). Moreover, each of the upper level interconnections 56a, 56b, 56c and 56d and each of the corresponding intermediate level interconnections 57a, 57b, 57c and 57d are connected to each other through the via-plug (whose illustration is omitted). In addition to refractory metals, Cu may be used for the via-plugs for connecting the intermediate level interconnections 57a, 57b, 57c and 57d and the lower level interconnections 58a, 58b, 58c and 58d, respectively, and the via-plugs for connecting the upper level interconnections 56a, 56b, 56c and 56d and the intermediate level interconnections 57a, 57b, 57c and 57d, respectively.

In FIG. 1, the upper level interconnections 56a, 56b, 56c and 56d are illustrated as the electrode layers on the most upper-level layer of the lower chip LC. However, the wiring lands 55a, 55b, 55c and 55d are metallurgically connected to the upper level interconnections 56a, 56b, 56c and 56d, respectively. Each of the wiring lands 55a, 55b, 55c and 55d can be made of gold (Au) or gold-alloy such as Au-silicon (Si), Au-germanium (Ge), Au-antimony (Sb) or Au-tin (Sn), each containing 80% or more of Au weight percent based on total alloy weight, and may have the multilevel structure in which a metal layer made of nickel (Ni) and the like is used as a base layer. For example, in the alloy phase diagram of Au—Ge, although a composition at which Ge is contained of approximately 12.5 wt % is close to eutectic composition, if melting point or hardness is considered, a composition that comes off from the eutectic composition may be used. Then, the wall-block patterns 53a, 53b are disposed so as to sandwich the array of the wiring lands 55a, 55b, 55c and 55d of the lower chip LC. A pattern of hydrophobic film 54 is delineated in the periphery of the upper surface of the lower chips LC, so that the pattern of hydrophobic films 54 is located on the further outside of the wall-block patterns 53a, 53b. Although the illustration is omitted, the wall-block patterns 53a, 53b are electrically connected to any of the wiring layers buried in the inter-layer insulating film 52 such as the upper level interconnection and the like, and the wall-block patterns 53a, 53b may be used as the electric wirings for the lower chip LC. The wall-block patterns 53a, 53b can be also made of Au or the alloy that contains 80% or more of Au weight percent based on total alloy weight. However, when the wall-block patterns 53a, 53b are formed by thermal imprint molding technique, using epoxy-based resin and the like, the micro processing can be easily carried out. In the case of using the epoxy-based resin and the like so as to form the wall-block patterns 53a, 53b by the thermal imprint molding technique, when the wall-block patterns 53a, 53b might be used concurrently as the electric wirings, additional wiring layers made of metallic thin films and the like may be formed on the surfaces of the wall-block patterns 53a, 53b.

On the other hand, in the upper chip UC, an inter-layer insulating film 32 is deposited under a semiconductor chip 31 illustrated in FIG. 1. Inside the inter-layer insulating film 32, lower level interconnections 38a, 38b, 38c and 38d each made of the metallic layer, such as Al, Al—Cu alloy or Cu damascene, and intermediate level interconnections 37a, 37b, 37c and 37d electrically connected through the inter-layer insulating film 32 under these lower level interconnections 38a, 38b, 38c and 38d, and upper level interconnections 36a, 36b, 36c and 36d electrically connected through the inter-layer insulating film 32 under the intermediate level interconnections 37a, 37b, 37c and 37d are buried. In addition, in FIG. 1, the orientation in which the upper level interconnections 36a, 36b, 36c and 36d are arranged under the intermediate level interconnections 37a, 37b, 37c and 37d, and the intermediate level interconnections 37a, 37b, 37c and 37d are arranged under the lower level interconnections 38a, 38b, 38c and 38d is explained as a matter of practical convenience, because in the illustrated multilevel interconnection structure, since the portion closer to the semiconductor chip 31 is assigned as the lower layer, and the upper and lower orientation as mentioned above is reversely defined against normal nomenclature.

Similarly to the case of the lower chip LC, although the inter-layer insulating film 32 is represented as if it was a single layer film in a rough outlined simple representation illustrated in FIG. 1, the inter-layer insulating film 32 is actually the multilevel insulating layer implemented by the triple or quadruple-level insulating layers. For the inter-layer insulating film 32 of the multilevel structure, for example, it is possible to use the inorganic-based insulating layer such as the $SiO_2$ film, the $Si_3N_4$ film, the PSG film, the SiOF film, the SiOC film and the like, and further, the organic-based insulating film such as the SiCOH, the HSQ, the porous methyl silsesquioxane film, the polyallylene, polyimide film and the like. Also, it is possible to combine and laminate those various insulating films and implement the inter-layer insulating film 32 of the various multilevel interconnection structures. Also, although FIG. 1 exemplifies the triple-level wiring layer for simplicity, actually, the multilevel interconnection layer implemented by quadruple levels to twelve levels or thirteen levels or more is employed on the basis of the design-based requirement. Moreover, similarly to the case of the lower chip LC, the lower level interconnections 38a, 38b, 38c and 38d, the intermediate level interconnections 37a, 37b, 37c and 37d, and the upper level interconnections 36a, 36b, 36c and 36d may not be implemented by the single-layer wirings made of the metals such as the Al—Cu alloy and the like as mentioned above, and may be implemented by the laminated structure in which the barrier layer made of the metals, such as Ti, Ta, Mn, Ru and the like, are formed in the upper and lower levels.

When the lower level interconnections 38a, 38b, 38c and 38d are assigned as the wiring layers of the first-level layer located closest to the semiconductor chip 31 of the upper chip UC, each of the lower level interconnections 38a, 38b, 38c and 38d serving as the wiring layers of the first-level layer and the impurity-diffused regions formed in the inside (surface portion) of the semiconductor chip 31 are connected to each other through the via-plug (whose illustration is omitted) penetrating partially through a part of the inter-layer insulating film 32. When the lower level interconnections 38a, 38b, 38c and 38d are assigned as the wiring layers of the first level, the lower level interconnections 38a, 38b, 38c and 38d may be composite-structure implemented by a impurity-doped polycrystalline-silicon layer and a silicide film of the polycrystalline-silicon layer with refractory metal such as Ta, Ti, W or V or the like. The via-plug (contact plug) may be also made of refractory metals such as Ta, Ti, W, V and the like. For example, when the via-plug is made of W, the barrier layer made of TiN/Ti and the like may be formed on the side wall of the via-hole (contact hole) in which the via-plug is formed and the surface of the impurity-diffused regions of the semiconductor chip 31. Similarly, each of the intermediate level interconnections 37a, 37b, 37c and 37d and each of the corresponding lower level interconnections 38a, 38b, 38c and 38d are connected to each other through the via-plug (whose illustration is omitted). Moreover, each of the upper level interconnections 36a, 36b, 36c and 36d and each of the corresponding intermediate level interconnections 37a, 37b, 37c and 37d are connected to each other through the via-plug (whose illustration is omitted). In addition to refractory metals, Cu may be used for the via-plugs for connecting the intermediate level interconnections 37a, 37b, 37c and 37d and the lower level interconnections 38a, 38b, 38c and 38d, respectively, and the via-plugs for connecting the upper level interconnections 36a, 36b, 36c and 36d and the intermediate level interconnections 37a, 37b, 37c and 37d, respectively.

Figure 17A:
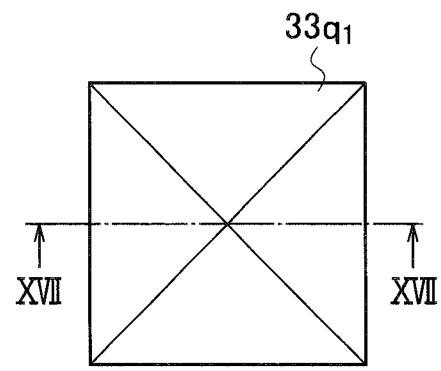
FIG. 17A is a schematic plan view that explains an example of a structure of a cone bump used correspondingly to the wall-block pattern illustrated in FIG. 16.
Figure 17B:
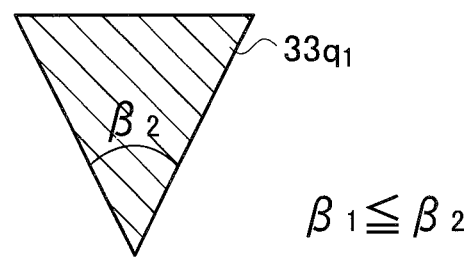
FIG. 17B is a cross-sectional view taken from an XVII-XVII direction in FIG. 17A.

In FIG. 1, the upper level interconnections 36a, 36b, 36c and 36d are illustrated as the electrode layers of the most upper-level layer of the upper chip UC. However, the wiring bumps 35a, 35b, 35c and 35d are metallurgically connected to the upper level interconnections 36a, 36b, 36c and 36d, respectively. Then, the cone bumps 33a, 33b are arranged so as to sandwich the array of the wiring bumps 35a, 35b, 35c and 35d of the lower chip LC. The wiring bumps 35a, 35b, 35c and 35d and the cone bumps 33a, 33b are preferable with respect to hardness and contact resistance, when they are made of gold or gold-alloy such as Au—Su or Au—Sn, each of alloy containing 80% or more of Au weight percent based on total alloy weight. A pattern of hydrophobic film 34 is delineated in the periphery on the lower surfaces of the upper chip UC, the hydrophobic film 34 is located on the further outside of the cone bumps 33a, 33b. Each of the cone bumps 33a, 33b is pyramidal, such as a cone bump $33p_1$ illustrated in FIGS. 12A and 12B and a cone bump $33q_1$ illustrated in FIGS. 17A and 17B, or conical such as a cone bump $33p_2$ illustrated in FIGS. 13A and 13B and a cone bump $33q_2$ illustrated in FIGS. 18A and 18B, and each tip of the cone bumps 33a, 33b implements a convex (a male type) thinner than the chip side. When the wall-block patterns 53a, 53b of the lower chip LC are electrically connected to the upper level interconnections of the lower chip LC, respectively, a physical contact between the cone bump 33a and the wall-block pattern 53a or a physical contact between the cone bump 33b and the wall-block pattern 53b can be used for electrical contact so that the cone bumps 33a, 33b can be electrically connect to the upper level interconnections of the upper chip UC, respectively.

Figure 11A:
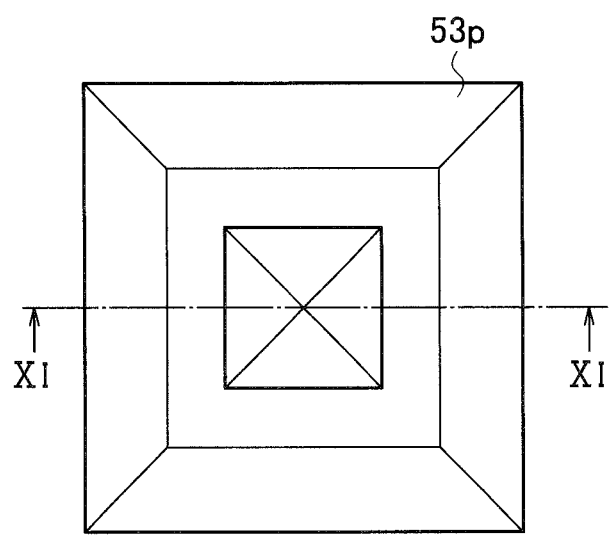
FIG. 11A is a schematic plan view that explains an example of a structure of a wall-block pattern adapted for the stacked device pertaining to the first embodiment.
Figure 11B:
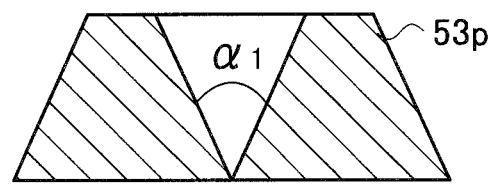
FIG. 11B is a cross-sectional view taken from an XI-XI direction in FIG. 11A.

On the other hand, each of the wall-block patterns 53a, 53b has the shape of a pyramidal frustum (truncated pyramid) that has a concave on its center as illustrated in FIGS. 11A and 11B. On the center of a wall-block pattern 53p illustrated in FIGS. 11A and 11B, concaves corresponding to the convex shapes of each of the cone bumps $33p_1$, $33p_2$ are formed. However, the shape of its concave is not designed as the perfectly opposite pattern (inversion pattern) to the shape of each of the cone bumps $33p_1$, $33p_2$. For this reason, each of the side walls of the cone bumps $33p_1$, $33p_2$ is shaped not to be perfectly contacted to the side wall of the wall-block pattern 53p. Consequently, while gap is provided in a part between each of the side walls of the cone bumps $33p_1$, $33p_2$ and the side wall of the wall-block pattern 53p, they are engaged and interlocked with each other.

For example, on the center of the wall-block pattern 53p illustrated in FIGS. 11A and 11B, the pyramidal concave of an apex angle $\alpha_1$ that is defined in the cross-section viewed from the XI-XI direction in FIG. 11A is formed. However, a value of the apex angle $\alpha_1$ is determined to be greater than an apex angle $\alpha_2$ ($\alpha_1 \geq \alpha_2$) that is defined in the cross-section viewed from the XII-XII direction in FIG. 12A, with regard to the pyramidal cone bump $33p_1$ illustrated in FIG. 12B. For this reason, the cone bump $33p_1$ and the wall-block pattern 53p are engaged and interlocked with each other, and the apex of the cone bump $33p_1$ arrives at the apex of the concave pyramid that serves as the bottom of the concave, which is cut in the center of the pyramidal wall-block pattern 53p. Thus, a high accuracy position-alignment in which a point and a point are coincident with each other is achieved. At this time, since the apex-angle relationship is set to the condition of $\alpha_1 \geq \alpha_2$, in the final state in which the apex of the cone bump $33p_1$ is coincident with the apex of the wall-block pattern 53p, the side wall of the concave of the wall-block pattern 53p is not in contact with the side wall of the cone bump $33p_1$. However, since the side wall of the concave of the wall-block pattern 53p is used as a guide, the apex of the cone bump $33p_1$ is guided to the apex of the wall-block pattern 53p. Hence, it is possible to easily carry out the self-alignment at the accuracy of 0.2 micrometer or less.

Figure 13A:
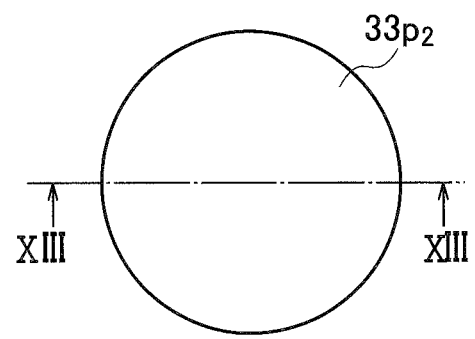
FIG. 13A is a schematic plan view that explains another example of the structure of the cone bump adapted for the stacked device pertaining to the first embodiment.
Figure 13B:
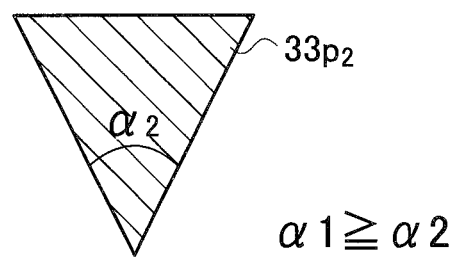
FIG. 13B is a cross-sectional view taken from an XIII-XIII direction in FIG. 13A.

Similarly, a value of an apex angle $\alpha_1$ of the wall-block pattern 53p is determined to be greater than an apex angle $\alpha_2$ ($\alpha_1 \geq \alpha_2$) that is defined in the cross-section viewed from the XIII-XIII direction in FIG. 13A, with regard to the conical cone bump $33p_2$ illustrated in FIG. 13B. Thus, as a result that the cone bump 342 and the wall-block pattern 53p are engaged and interlocked with each other, the apex of the cone bump $33p_2$ finally arrives at the apex of the concave pyramid that serves as the bottom of the concave, which is cut in the center of the wall-block pattern 53p. Thus, a high accuracy position-alignment in which the point and the point are coincident with each other is achieved. In the final state in which the apex of the cone bump $33p_2$ is coincident with the apex of the wall-block pattern 53p, the condition of $\alpha_1 \geq \alpha_2$ disables the side wall of the concave of the wall-block pattern 53p to contact with the side wall of the cone bump $33p_2$. However, since the side wall of the concave of the wall-block pattern 53p is used as the guide, the apex of the cone bump $33p_2$ is guided to the apex of the wall-block pattern 53p. Hence, it is possible to easily carry out the self-alignment at the accuracy of 0.2 micrometer or less.

Figure 8:
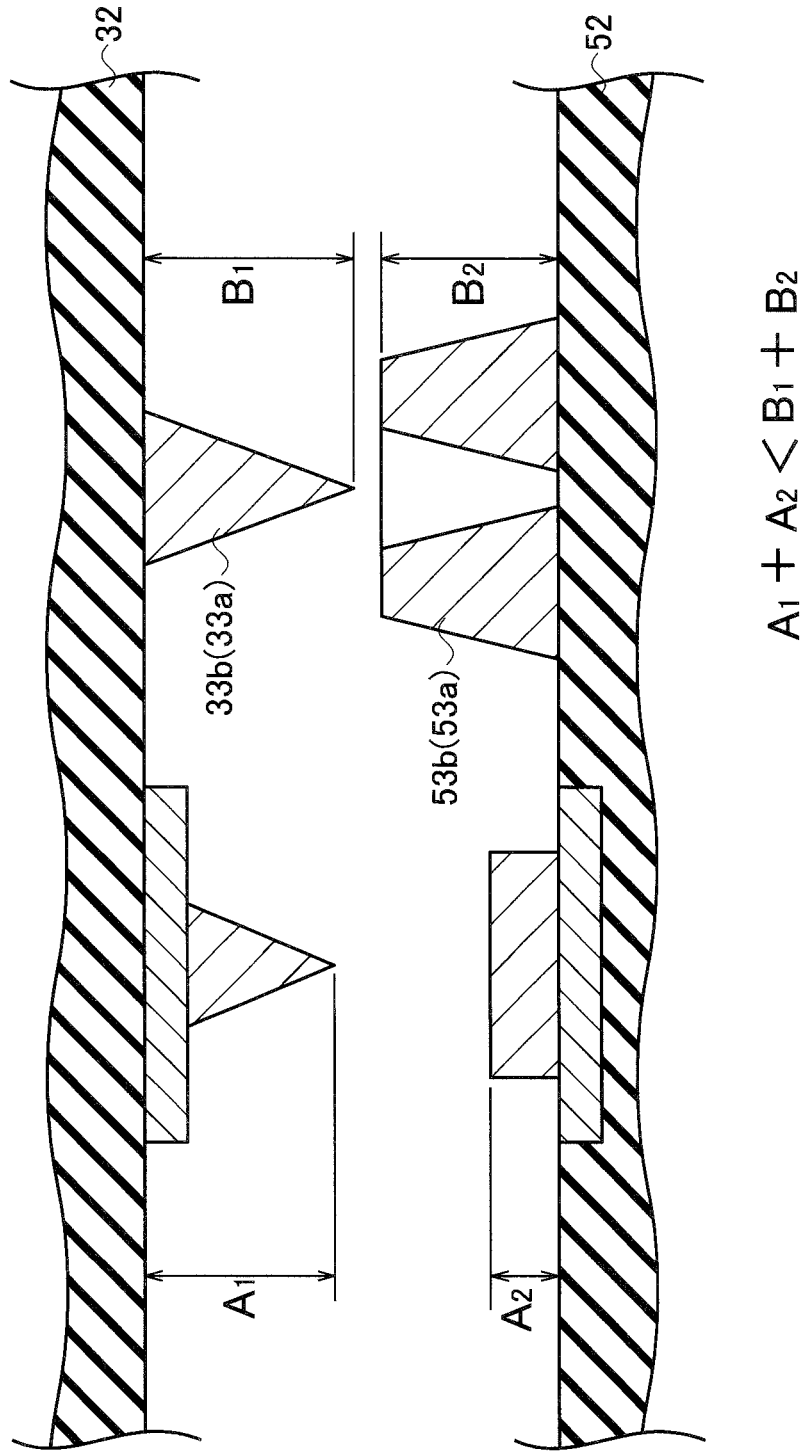
FIG. 8 is a schematic cross-sectional view that explains a relation between respective heights of an wiring land, an wiring bump, a wall-block pattern and a cone bump, with regard to the stacked device pertaining to the first embodiment.

As illustrated in FIG. 8, a height B1 of the cone bump 33b (33a) measured from the reference plane of the upper chip UC is higher than a height $A_1$ of the wiring bumps 35a, 35b, 35c and 35d measured from the reference plane. In FIG. 8, the height $A_1$ is defined such that the height $A_1$ includes the thicknesses of the upper level interconnections 36a, 36b, 36c and 36d, on which the wiring bumps 35a, 35b, 35c and 35d are provided. However, differently from the configuration illustrated in FIG. 1, when the upper level interconnections 36a, 36b, 36c and 36d are buried in the inside of the inter-layer insulating film 32, the height $A_1$ is measured from the lower plane (surface) of the inter-layer insulating film 32.

As illustrated in FIG. 8, a height $B_2$ of the wall-block pattern 53b (53a) measured from the reference plane of the lower chip LC is higher than a height $A_2$ of the wiring lands 55a, 55b, 55c and 55d measured from the reference plane of the lower chip LC. Then, the stacked device pertaining to the first embodiment is schemed so as to satisfy the following Eq. (1):

$$A_1+A_2<B_1+B_2 \qquad (1)$$

Consequently, a step in which the apex of the cone bump 33b (33a) is made coincident with the apex of the concave of the wall-block pattern 53b (53a) by the self-alignment is made easy. That is, since it is set to satisfy the relation of Eq. (1), the apex of the pyramidal cone bump $33p_1$ illustrated in FIGS. 12A and 12B or the apex of the conical cone bump $33p_2$ illustrated in FIGS. 13A and 13B arrives at the apex of the concave pyramid cut in the center of the wall-block pattern 53p illustrated in FIGS. 11A and 11B, and the position-alignment in which the point and the point are made coincident with each other is achieved by the self-alignment, and the position-aligning of a high accuracy of 0.2 micrometer or less is achieved.

Hereinafter, a method of manufacturing (the method of assembling) the stacked device pertaining to the first embodiment of the present invention will be explained, referring to FIGS. 2 to 7. In addition, the method of manufacturing an upper chip UC and a lower chip LC adapted for the stacked device will be described later by using FIGS. 9A, 9B, 9C, 9D, 9E, 10A, 10B, 10C, 10D and 10E. Also, because the method of manufacturing the stacked device will be explained as one of the examples, the method of manufacturing the stacked device can be naturally achieved by various manufacturing methods other than the following explanation, including various variation examples, within the range of the scope and spirit, which are described in claims.

Figure 2:
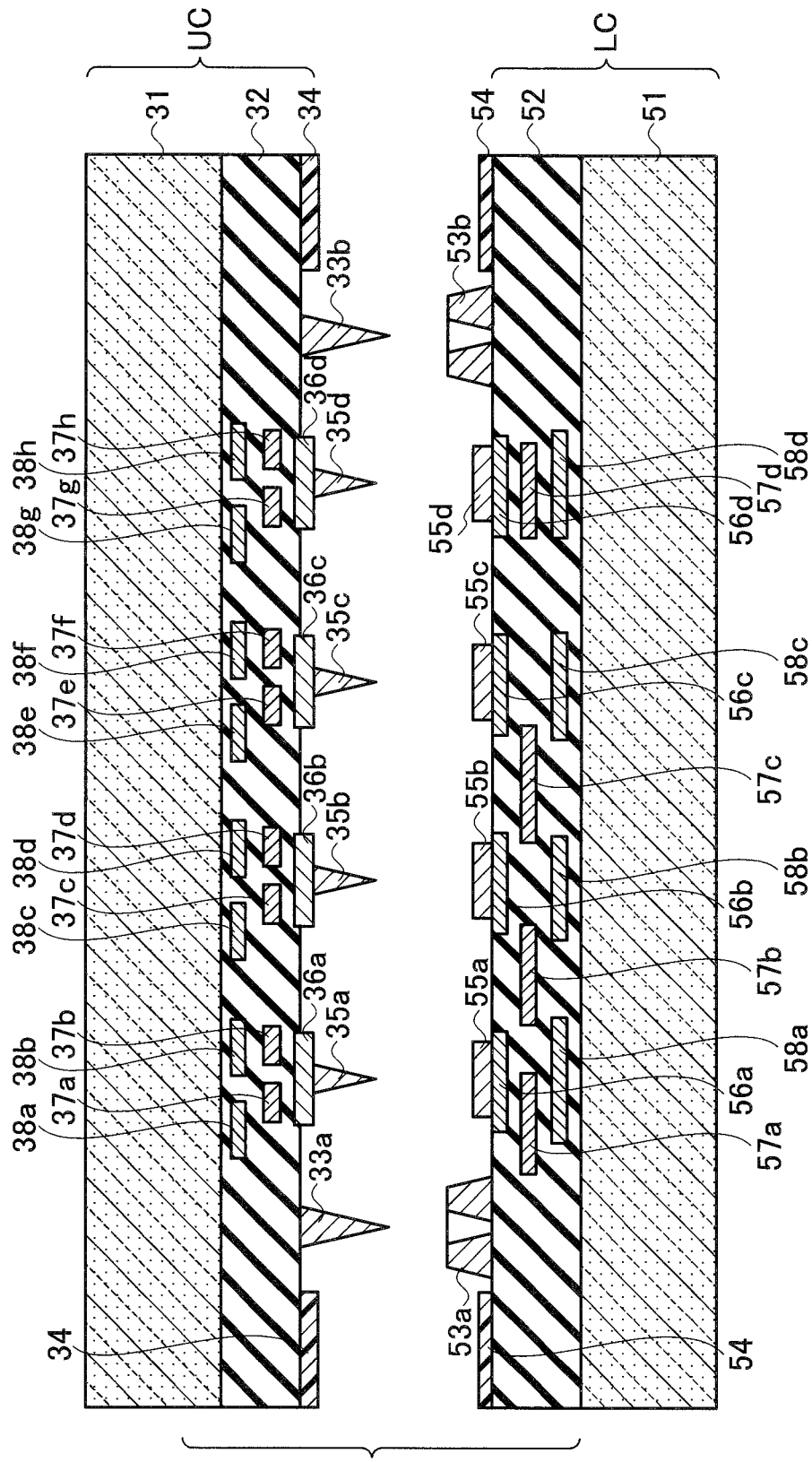
FIG. 2 is a schematic step cross-sectional view explaining a rough outline of a method of manufacturing the stacked device pertaining to the first embodiment.

(a) At first, as illustrated in FIG. 2, a lower chip LC having wiring lands 55a, 55b, 55c and 55d, a plurality of wall-block patterns 53a, 53b, which are arranged at the positions outside the array of the wiring lands 55a, 55b, 55c and 55d, respectively, and an upper chip UC having a plurality of wiring bumps 35a, 35b, 35c and 35d assigned correspondingly to the positions of the wiring lands 55a, 55b, 55c and 55d, respectively and a plurality of cone bumps 33a, 33b assigned correspondingly to the positions of the plurality of wall-block patterns 53a, 53b, respectively, are prepared. In FIG. 2, the pattern of the hydrophobic film 54 is delineated in the periphery on the upper surface of the lower chip LC, which is assigned in an area outside the wall-block patterns 53a, 53b. Similarly, the pattern of a hydrophobic film 34 is delineated in the periphery on the lower surface of the upper chip UC, which is assigned in an area outside the cone bumps 33a, 33b.

(b) Next, when a liquid 7 is brought into direct contact with the lower chip LC or when a nozzle is used to spray the liquid 7 onto the lower chip LC, the hydrophobic film 54 of the lower chip LC causes the droplet of the liquid 7 to stay in the area inside the hydrophobic film 54, and the droplet of the liquid 7 is selectively coated on the area inside the hydrophobic film 54. In order to bring the liquid 7 into direct contact with the lower chip LC, it is possible to employ:

a method of immersing the lower chip LC into the liquid 7 stored in a vessel and then taking out the lower chip LC from the vessel;

a method of downwardly bringing the lower chip LC into contact with the liquid 7 stored in a vessel and then pulling out the lower chip LC; or a method of pouring or dropping the liquid 7 onto the lower chip LC.

Figure 3:
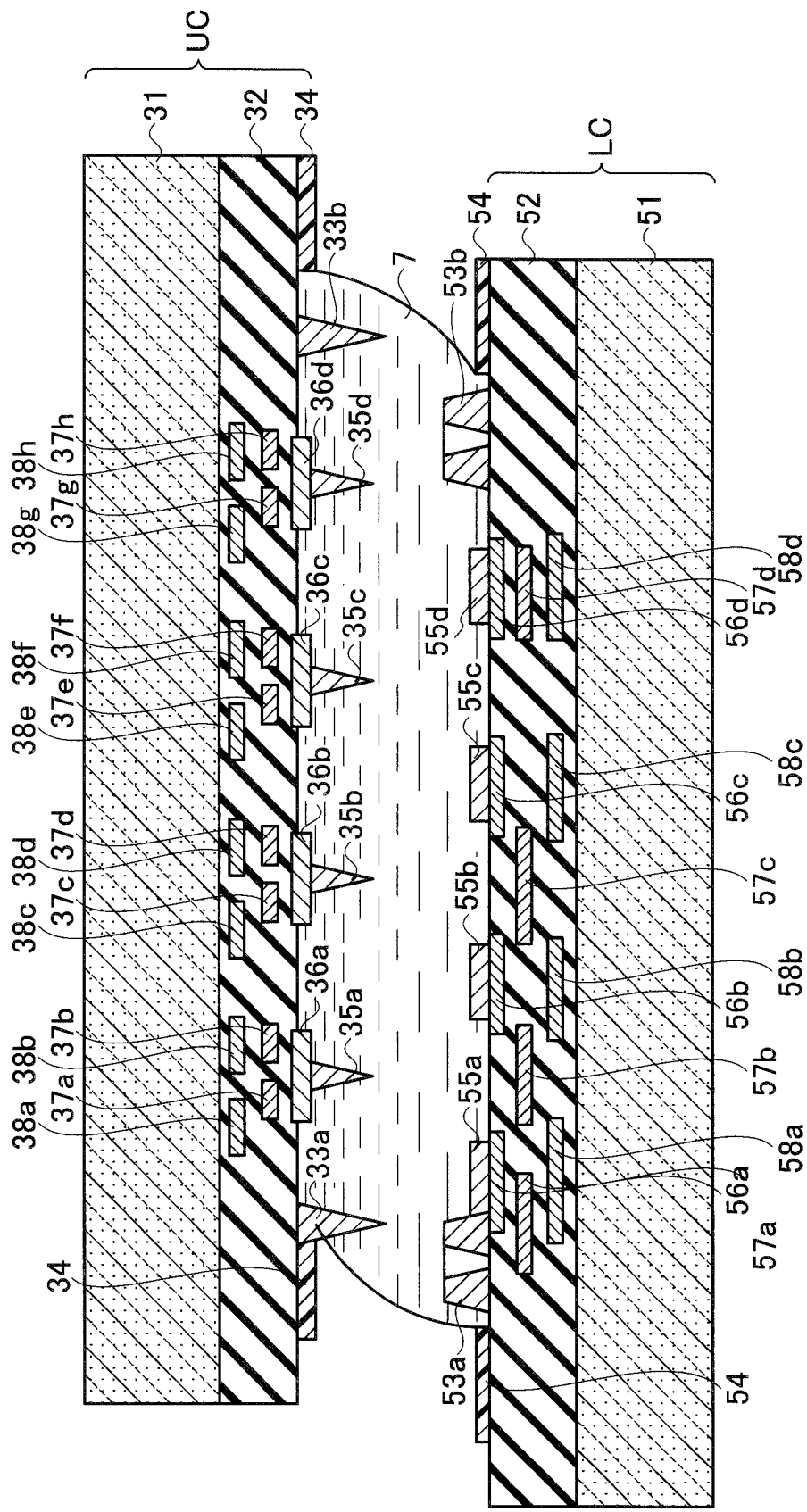
FIG. 3 is a schematic step cross-sectional view of the method of manufacturing the stacked device pertaining to the first embodiment, which explains a next step of the stage illustrated in FIG. 2.

As the method of spraying the liquid 7 to the lower chip LC, a method of placing a nozzle opposite to the lower chip LC and spraying the liquid 7 from the nozzle to the lower chip LC is typical. The liquid 7 may be sprayed from many nozzles to the entire surface of the lower chip LC, or the liquid 7 may be selectively sprayed from a nozzle, which is allocated so as to face selectively to an area in the inside of the pattern of the hydrophobic film 34. At that time, it is allowable to control the quantity of the liquid 7 that is sprayed, on the basis of planar dimension of the area in the inside of the pattern of the hydrophobic film 34. As the liquid 7, it is possible to use water, or different inorganic liquid, or various organic liquids. For example, as the liquid 7, it is possible to use glycerin, acetone, alcohol, hydro-fluoro-ether, spin•on•glass (SOG) and the like. As the SOG, it is possible to use phosphorous doped silicate based SOG, methyl siloxane-based SOG and the like. After that, through the droplet of the liquid 7, as illustrated in FIG. 3, the plurality of wiring bumps 35a, 35b, 35c and 35d in the upper chip UC are made opposite to the wiring lands 55a, 55b, 55c and 55d in the lower chip LC, respectively, and a rough position-alignment is carried out between the upper chip UC and the lower chip LC.

Figure 4:
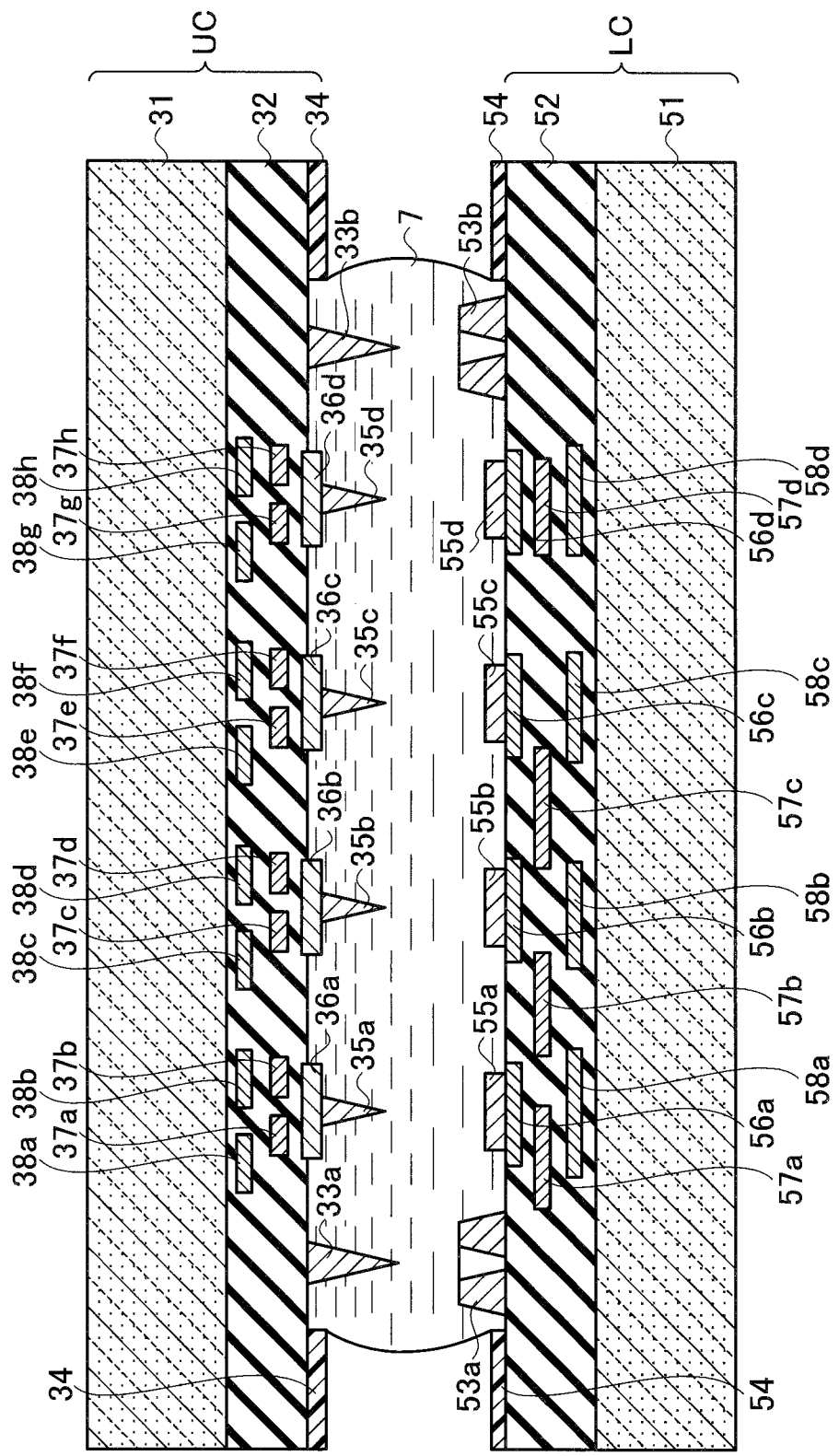
FIG. 4 is a schematic step cross-sectional view of the method of manufacturing the stacked device pertaining to the first embodiment, which explains a next step of the stage illustrated in FIG. 3.

(c) On the lower surface of the upper chip UC, there is a pattern of hydrophobic film 34. Thus, as illustrated in FIG. 4, the surface tension of the droplet of the liquid 7 enables the plurality of wiring bumps 35a, 35b, 35c and 35d to be preliminary position-aligned at the positions of the wiring lands 55a, 55b, 55c and 55, respectively, by the self-alignment. At this time, simultaneously, the plurality of cone bumps 33a, 33b are preliminary position-aligned at the plurality of wall-block patterns 53a, 53b, respectively, by the self-alignment, and the upper chip UC and the lower chip LC are set to the substantially desirable position relation.

Figure 5:
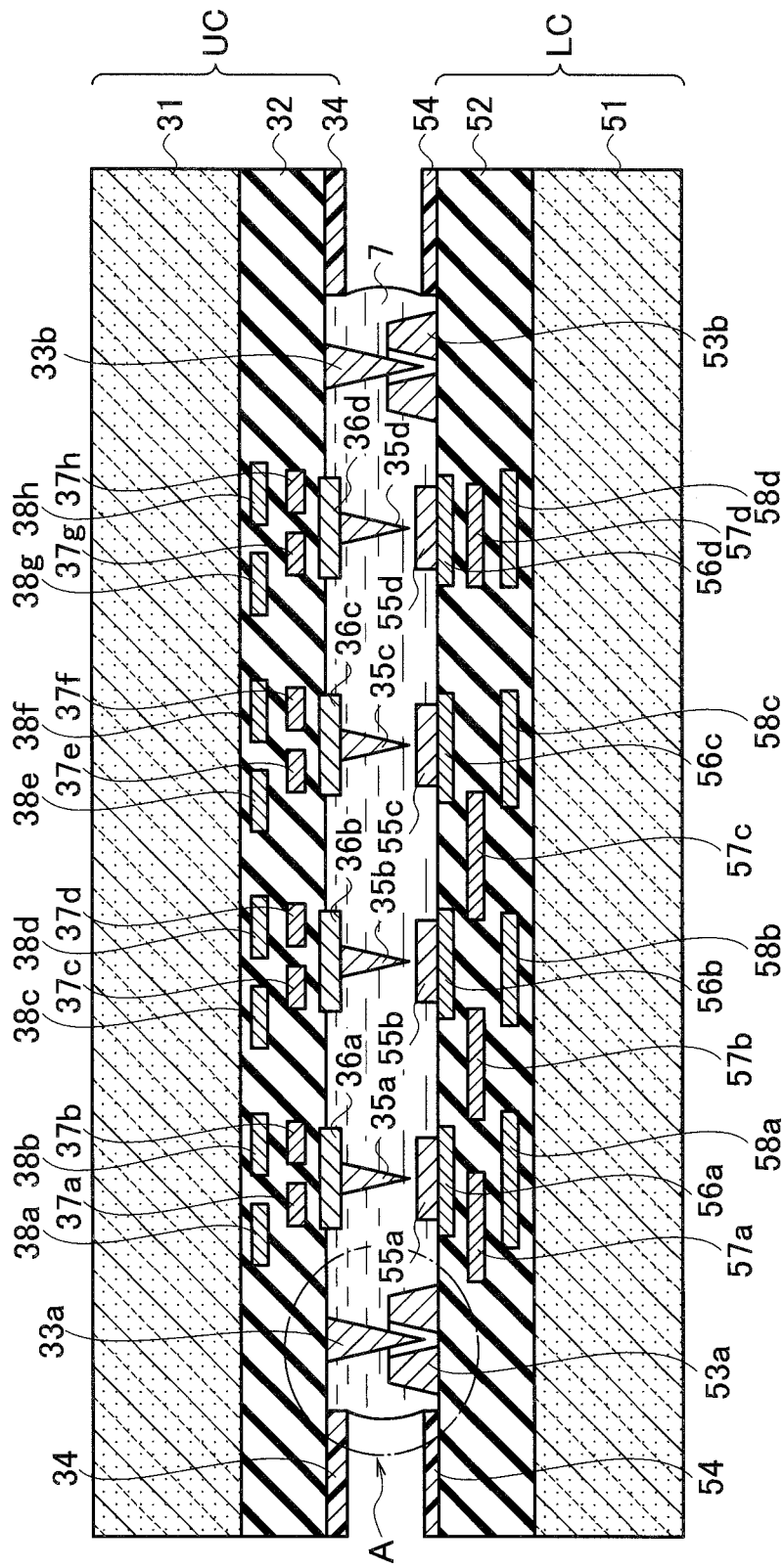
FIG. 5 is a schematic step cross-sectional view of the method of manufacturing the stacked device pertaining to the first embodiment, which explains a next step of the stage illustrated in FIG. 4.
Figure 6:
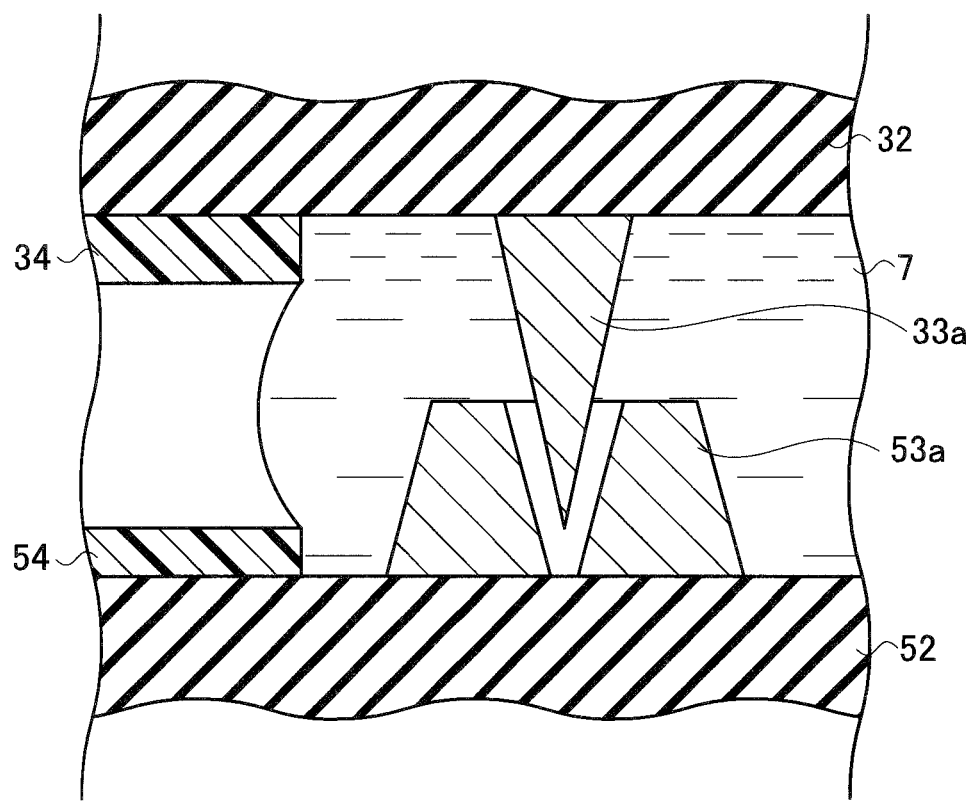
FIG. 6 is an enlarged cross-sectional view illustrating the A portion on the left side of FIG. 5.

(d) In a situation in which as illustrated in FIG. 4, the preliminary position-alignment is achieved by the self-alignment based on the surface tension of the liquid 7, when further as illustrated in FIG. 5, the upper chip UC is pushed against the lower chip LC, the cone bumps 33a, 33b arranged in the periphery of the upper chip UC are brought into contact with the inclined planes of the wall-block patterns 53a, 53b arranged in the periphery of the lower chip LC, respectively, and the position-aligning is consequently progressed at a finer accuracy. FIG. 6 shows the enlarged view of the A portion surrounded by a dash-dotted line shown on the left side in FIG. 5. However, with the interposition of the droplet of the liquid 7, the wall-block pattern 53a of the lower chip LC and the cone bump 33a of the upper chip UC are engaged and interlocked with each other because the mutual side walls receive a lubrication action via the liquid 7. In this way, since the lubrication action is received via the liquid 7, the wall-block pattern 53a and the cone bump 33a are engaged and interlocked with each other. Similarly, the wall-block pattern 53b and the cone bump 33b are engaged and interlocked with each other. Consequently, the position-aligning is progressed at finer accuracy.

Figure 7:
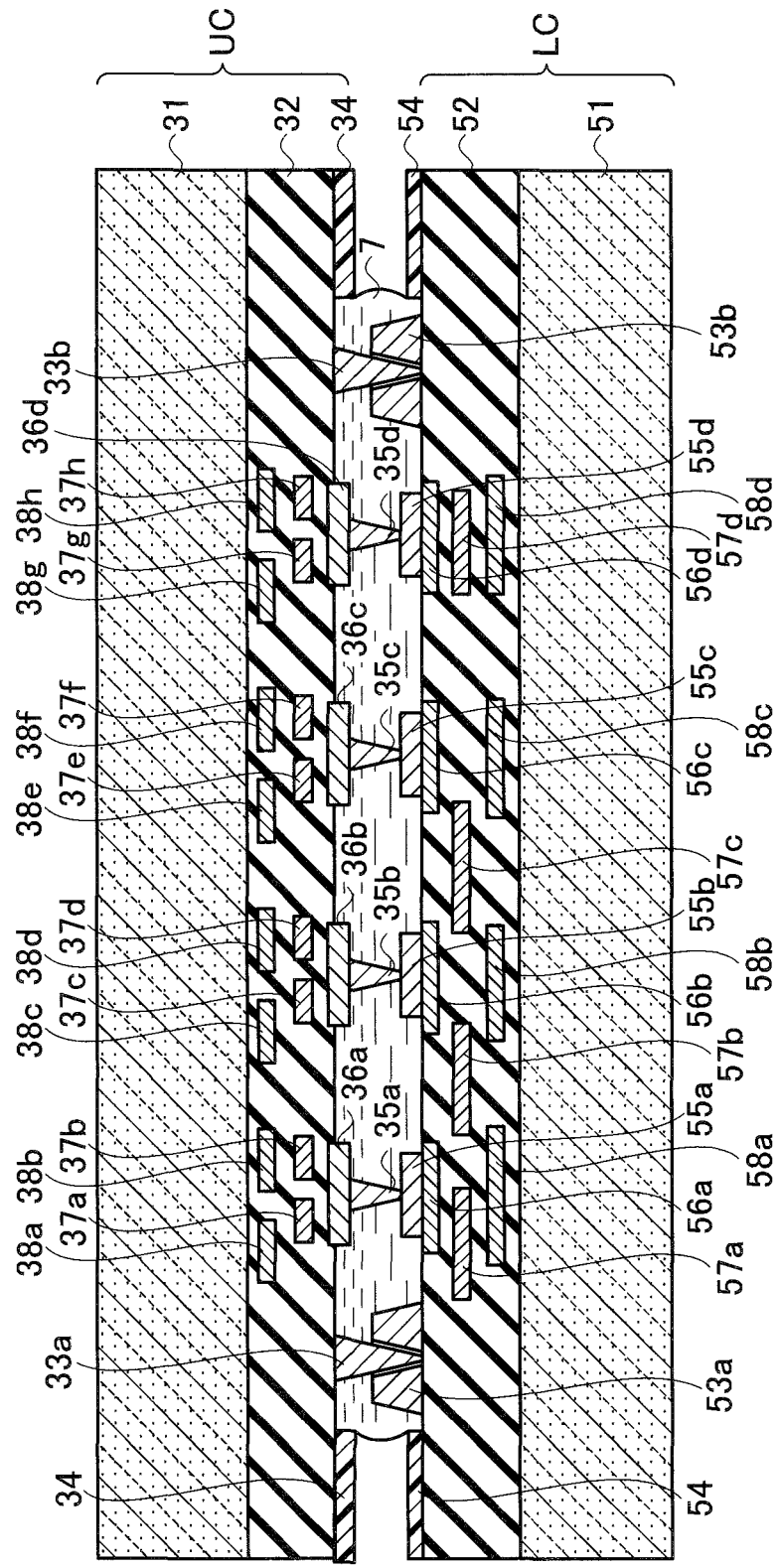
FIG. 7 is a schematic step cross-sectional view of the method of manufacturing the stacked device pertaining to the first embodiment, which explains a next step of the stage illustrated in FIG. 5.

(e) When from the situation illustrated in FIG. 5, the upper chip UC further continues to be pushed against the lower chip LC while they are heated, the position-alignment at finer accuracy level is progressed. Consequently, as illustrated in FIG. 7, the tips of the wiring bumps 35a, 35b, 35c and 35d of the upper chip UC are brought into contact with the wiring lands 55a, 55b, 55c and 55d of the lower chip LC, respectively, and the wiring lands 55a, 55b, 55c and 55d are thermo-compression bonded to the corresponding wiring bumps 35a, 35b, 35c and 35d, respectively. At this time, since the heights of the cone bumps 33a, 33b and the heights of the wiring bumps 35a, 35b, 35c and 35d are adjusted to the relation represented by Eq. (1), the tips of the cone bumps 33a, 33b are lowered while the above tips are in contact with the inclined planes of the concaves on the centers of the wall-block patterns 53a, 53b, respectively, and finally arrives at the bottoms of the concaves of the wall-block patterns 53a, 53b, respectively. Consequently, in the situation illustrated in FIG. 7, at a high accuracy of 0.2 micrometer or less, the upper chip UC and the lower chip LC are aligned and firmly bonded.

(f) The step of pushing the upper chip UC against the lower chip LC from the situation illustrated in FIG. 5 to the situation illustrated in FIG. 7 is carried out inside a reduced-pressure chamber (vacuum chamber) or high temperature bath. Thus, when a decompressing or heating process is added to the above pushing step, the liquid 7 is evaporated in the situation in which a high accuracy position-alignment is achieved as illustrated in FIG. 7. Hence, the stacked device is finally completed as illustrated in FIG. 1.

One example of the method of manufacturing the upper chip UC and the lower chip LC used in the above explanation will be described below referring to FIGS. 9A, 9B, 9C, 9D, 9E, 10A, 10B, 10C, 10D and 10E.

<Preparation of Lower Chip LC>

Figure 9A:
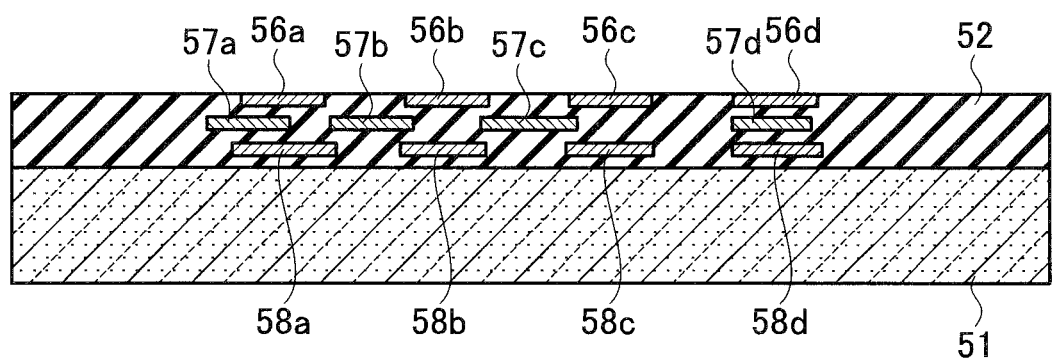
FIG. 9A is a schematic process-flow cross-sectional view that explains a rough outline of a method of manufacturing a lower chip adapted for the stacked device pertaining to the first embodiment.

(a) As illustrated in FIG. 9A, an IC chip is prepared in which the inter-layer insulating film 52 is arranged on the semiconductor chip 51, and inside the inter-layer insulating film 52, lower level interconnections 58a, 58b, 58c and 58d, intermediate level interconnections 57a, 57b, 57c and 57d, and upper level interconnections 56a, 56b, 56c and 56d are buried. FIG. 9A exemplifies the multilevel interconnection structure of triple levels, for simplicity. Actually, the fact that the multilevel interconnection structure implemented by quadruple levels to twelve levels or thirteen levels or more may be used on the basis of the design-based requirement is as mentioned above. Also, although the illustration is omitted, each of the lower level interconnections 58a, 58b, 58c and 58d that serve as the wiring layers of the first level and the impurity-diffused regions formed in the inside (surface portion) of the semiconductor chip 51 are connected to each other through the via-plug, and each of the intermediate level interconnections 57a, 57b, 57c and 57d and each of the corresponding lower level interconnections 58a, 58b, 58c and 58d are connected to each other through the via-plug, and each of the upper level interconnections 56a, 56b, 56c and 56d and each of the corresponding intermediate level interconnections 57a, 57b, 57c and 57d are connected to each other through the via-plug.

Figure 9B:
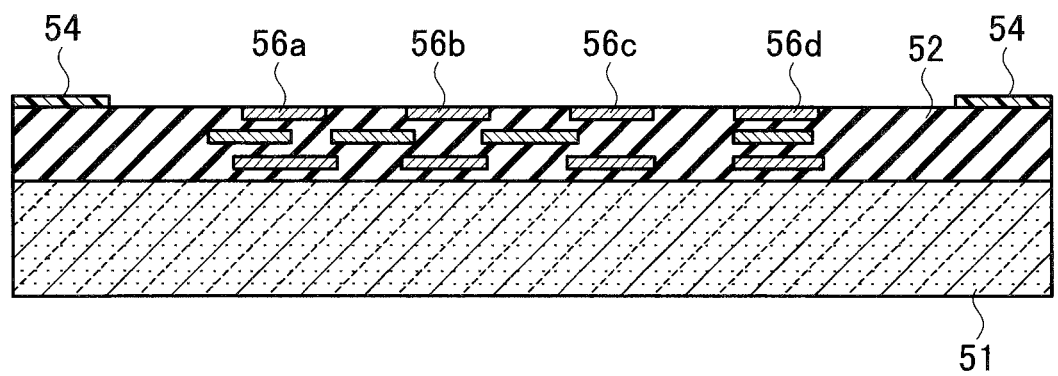
FIG. 9B is a subsequent cross sectional view in the process-flow of the method of manufacturing the lower chip adapted for the stacked device pertaining to the first embodiment, which explains a next step of the stage illustrated in FIG. 9A.

(b) On the upper surface of the inter-layer insulating film 52, a fluoro carbon film is deposited by plasma polymerization. Moreover, a photo-resist film is coated on this fluoro carbon film. Then, a photolithography technique is used to carry out a patterning process so that the photo-resist film remains on only the periphery of the inter-layer insulating film 52. Then, the photo-resist film is used as mask, and the fluoro carbon film is selectively removed. Moreover, when the photo-resist film used as the mask for the selective etching is ashed by oxygen ($O_2$) plasma, as illustrated in FIG. 9B, the pattern of the hydrophobic film 54 is delineated on the periphery of the upper surface of the inter-layer insulating film 52 in the lower chip LC. Or, the patterning process is carried out such that parylene film is coated on the upper surface of the inter-layer insulating film 52, and the photo-resist film is coated on this parylene film, and with the photolithography technique, the photo-resist film remains on only the periphery of the inter-layer insulating film 52. Then, with the photo-resist film as the mask, the parylene film is selectively removed, and the photo-resist film used as the mask for the selective etching is ashed by the oxygen ($O_2$) plasma. Consequently, as illustrated in FIG. 9B, the pattern of the hydrophobic film 54 is delineated on the periphery of the upper surface of the inter-layer insulating film 52 in the lower chip LC.

Figure 9C:
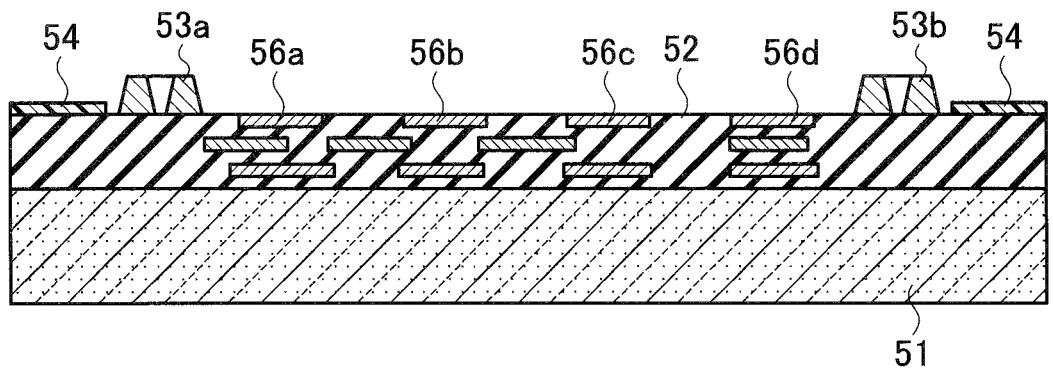
FIG. 9C is a subsequent cross sectional view in the process-flow of the method of manufacturing the lower chip adapted for the stacked device pertaining to the first embodiment, which explains a next step of the stage illustrated in FIG. 9B.

(c) Next, as illustrated in FIG. 9C, the wall-block patterns 53a, 53b are formed in an area located inside the pattern of the hydrophobic film 54, which is also a place close to the pattern of the hydrophobic film 54. The wall-block patterns 53a, 53b may be formed such that the thermal imprint molding is performed on epoxy-based ultraviolet (UV) curable resin. For example, at first, a metal mold serving as replicas of the wall-block patterns 53a, 53b to be delineated is prepared by nickel electro-casting and the like. Then, the metal mold serving as the replica is pushed against the soft epoxy-based UV curable resin prior to the curing. Consequently, the shape of the metal mold is transferred. After that, UV light is irradiated to the epoxy-based UV curable resin, and post-baking is carried out. Then, by completely curing the transferred and molded epoxy-based UV curable resin, it is possible to achieve the shapes of the patterns of the wall-block patterns 53a, 53b.

Figure 9D:
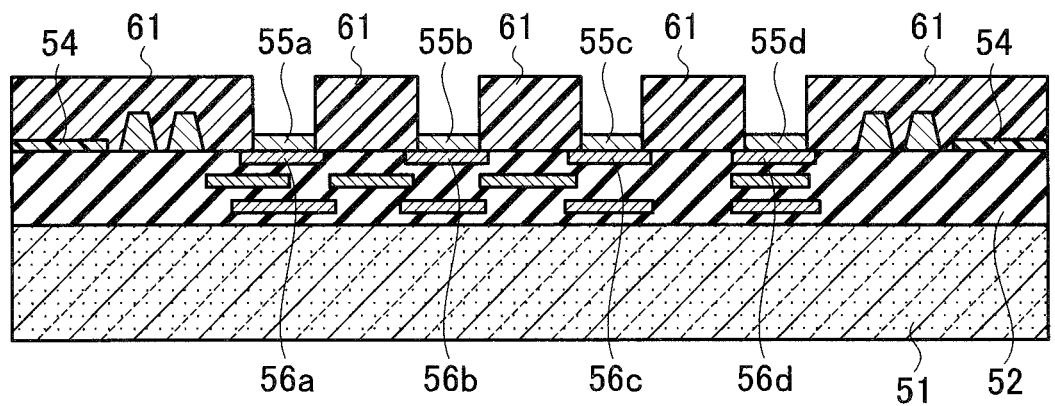
FIG. 9D is a subsequent cross sectional view in the process-flow of the method of manufacturing the lower chip adapted for the stacked device pertaining to the first embodiment, which explains a next step of the stage illustrated in FIG. 9C.

(d) Moreover, a photo-resist film 61 is coated on the entire surface of the upper surface of the inter-layer insulating film 52 in the lower chip LC, and the photolithography technique is used to open windows in the photo-resist film 61 so that parts of the upper surfaces of the patterns of the upper level interconnections 56a, 56b, 56c and 56d are exposed. Then, on the upper level interconnections 56a, 56b, 56c and 56d exposed in those windows, nickel (Ni) layers are formed as base-layers by electrolytic plating or non-electrolytic plating. Moreover, on the Ni layer, gold (Au) layer is formed by the electrolytic plating or non-electrolytic plating. Consequently, the pattern of the wiring lands 55a, 55b, 55c and 55d implemented by double-layer structure of Ni/Au is delineated as illustrated in FIG. 9D.

Figure 9E:
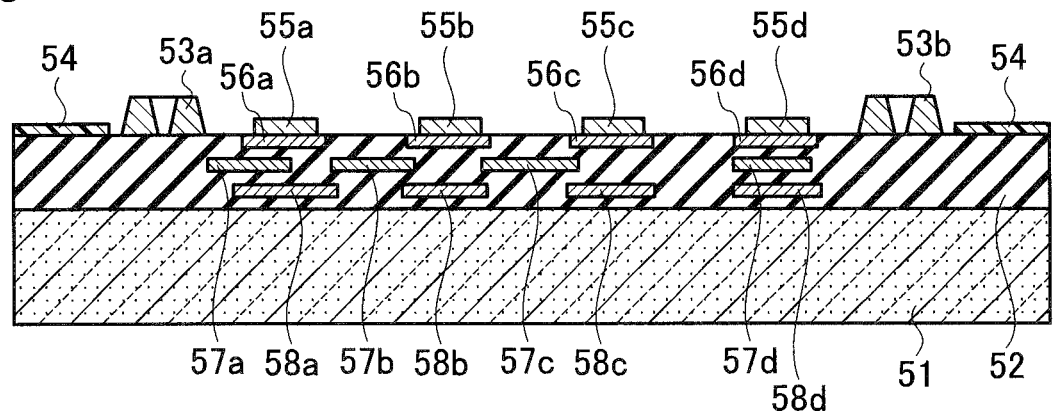
FIG. 9E is a subsequent cross sectional view in the process-flow of the method of manufacturing the lower chip adapted for the stacked device pertaining to the first embodiment, which explains a next step of the stage illustrated in FIG. 9D.

(e) After that, when the photo-resist film 61 used in the selective plating of Ni/Au is removed, the lower chip LC is completed as illustrated in FIG. 9E.

<Preparation of Upper Chip UC>

Figure 10A:
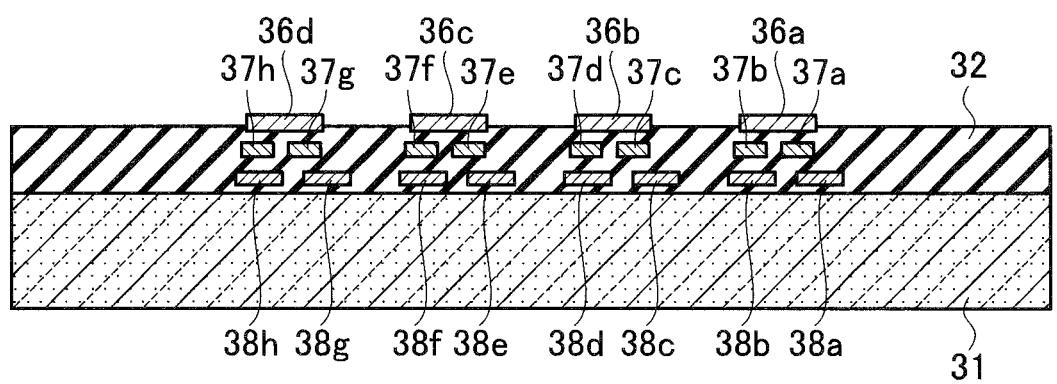
FIG. 10A is a schematic process-flow cross-sectional view that explains a rough outline of a method of manufacturing an upper chip adapted for the stacked device pertaining to the first embodiment.

(a) As illustrated in FIG. 10A, an IC chip is prepared in which the inter-layer insulating film 32 is arranged on the semiconductor chip 31, and inside the inter-layer insulating film 32, lower level interconnections 38a, 38b, 38c and 38d, intermediate level interconnections 37a, 37b, 37c and 37d, and upper level interconnections 36a, 36b, 36c and 36d are buried. Between each of the lower level interconnections 38a, 38b, 38c and 38d that serve as the wiring layers of the first level and the impurity-diffused regions formed in the inside (surface portion) of the semiconductor chip 31, between each of the intermediate level interconnections 37a, 37b, 37c and 37d and each of the corresponding lower level interconnections 38a, 38b, 38c and 38d, and each of the upper level interconnections 36a, 36b, 36c and 36d and each of the corresponding intermediate level interconnections 37a, 37b, 37c and 37d, the via-plugs whose illustrations are omitted are allocated. FIG. 10A exemplifies the multilevel interconnection structure of triple levels for simplicity. Actually, the fact that the multilevel interconnection structure implemented by quadruple levels to twelve levels or thirteen levels or more may be used on the basis of the design-based requirement is similar to the lower chip LC.

Figure 10B:
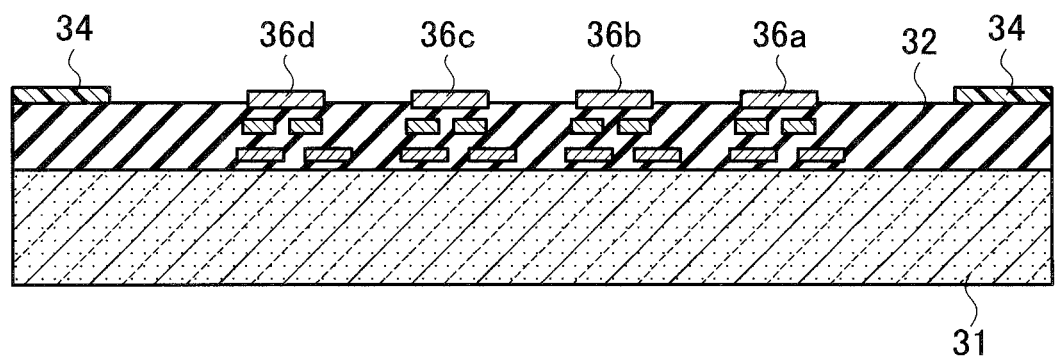
FIG. 10B is a subsequent cross sectional view in the process-flow of the method of manufacturing the upper chip adapted for the stacked device pertaining to the first embodiment, which explains a next step of the stage illustrated in FIG. 10A.

(b) Next, on the upper surface of the inter-layer insulating film 32, the fluoro carbon film is deposited by the plasma polymerization. Moreover, the photo-resist film is coated on this fluoro carbon film. Then, the photolithography technique is used to carry out the patterning process so that the photo-resist film remains on only the periphery of the inter-layer insulating film 32. Then, the photo-resist film is used as the mask, and the fluoro carbon film is selectively removed. Moreover, when the photo-resist film used as the mask for the selective etching is ashed by the oxygen ($O_2$) plasma, as illustrated in FIG. 10B, the pattern of the hydrophobic film 34 is delineated on the periphery of the upper surface of the inter-layer insulating film 32 in the lower chip LC. Or, the patterning process is carried out such that the parylene film is coated on the upper surface of the inter-layer insulating film 32, and the photo-resist film is coated on this parylene film, and with the photolithography technique, the photo-resist film remains on only the periphery of the inter-layer insulating film 32. Then, with the photo-resist film as the mask, the parylene film is selectively removed, and the photo-resist film used as the mask for the selective etching is ashed by the oxygen ($O_2$) plasma. Consequently, as illustrated in FIG. 10B, the pattern of the hydrophobic film 34 is delineated in the periphery of the upper surface of the inter-layer insulating film 32 in the lower chip LC.

Figure 10C:
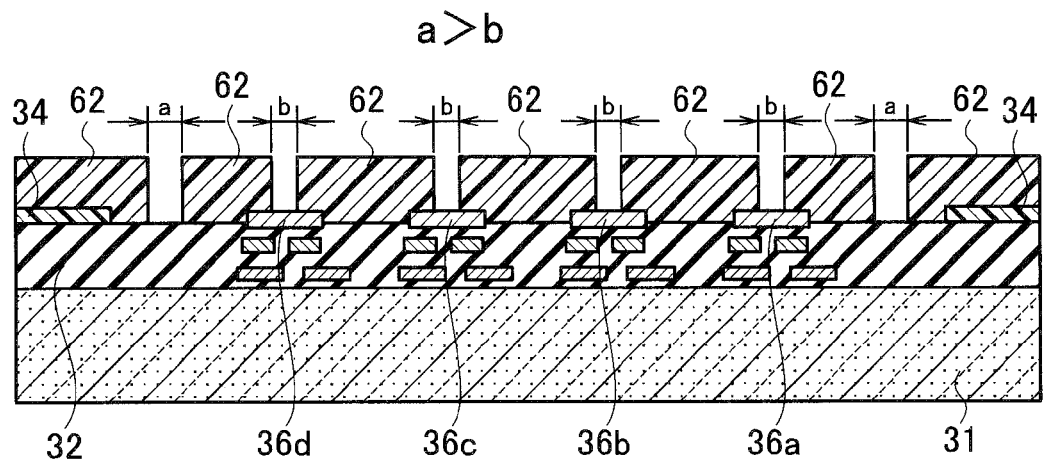
FIG. 10C is a subsequent cross sectional view in the process-flow of the method of manufacturing the upper chip adapted for the stacked device pertaining to the first embodiment, which explains a next step of the stage illustrated in FIG. 10B.

(c) Moreover, a photo-resist film 62 is coated on the entire surface of the upper surface of the inter-layer insulating film 32 in the upper chip UC. Then, as illustrated in FIG. 10C, the photolithography technique is used to open windows in the photo-resist film 62 so that parts of the upper surfaces of the patterns of the upper level interconnections 36a, 36b, 36c and 36d, and parts of the upper surface of the inter-layer insulating film 32 outside the array of the upper level interconnections 36a, 36b, 36c and 36d are exposed. At this time, width "b" of the window for opening each of the parts of the upper surfaces of the patterns of the upper level interconnections 36a, 36b, 36c and 36d is set to be smaller than width "a" (a>b) of the window opened to expose each of the parts of the upper surfaces of the inter-layer insulating film 32 outside the array of the patterns of the upper level interconnections 36a, 36b, 36c and 36d.

Figure 10D:
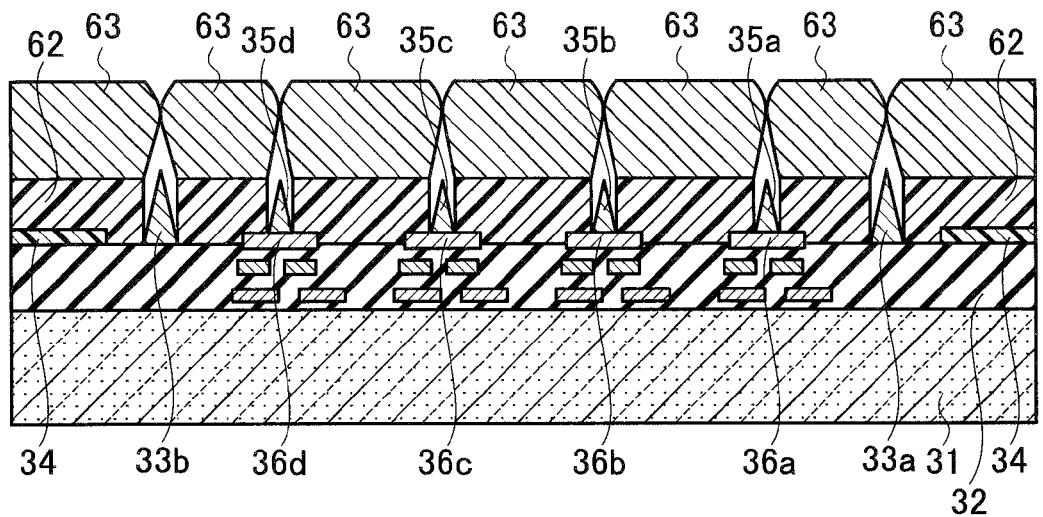
FIG. 10D is a subsequent cross sectional view in the process-flow of the method of manufacturing the upper chip adapted for the stacked device pertaining to the first embodiment, which explains a next step of the stage illustrated in FIG. 10C.

(d) Then, using the photo-resist film 62 as the mask, onto the upper level interconnections 36a, 36b, 36c and 36d exposed in the windows of the photo-resist film 62, and onto the upper surface of the inter-layer insulating film 32 exposed outside the array of the patterns of the upper level interconnections 36a, 36b, 36c and 36d, a gas deposition method is used to spray metallic nano-particles together with inactive gas such as helium (He) and the like. Here, as the metallic nano-particle, it is possible to employ the nano-particle of gold (Au) or alloy that includes Au mole fraction of 80% or more. From above the photo-resist film 62, the gas deposition method is used to spray the nano-dimensional metallic particles evaporated from a crucible of a high temperature, together with the inactive gas under a reduced-pressure condition. Thus, the metals are deposited within the window opened in the photo-resist film 62. As illustrated in FIG. 10D, during the gas deposition method, at this time, metals 63 are simultaneously deposited even on the fringe areas of the windows, and a canopy (overhang) that covers the window is formed on the fringe areas of the windows. As the canopy grows on the fringe areas of the windows, the opening diameter of the window is decreased. Consequently, within the windows, the wiring bumps 35a, 35b, 35c and 35d and the cone bumps 33a, 33b each having the shape of a pyramidal metallic protrusion are formed by the self-alignment. Because the window of the photo-resist will automatically close, while the width "b" of the window for opening each of the parts of the upper surfaces of the patterns of the upper level interconnections 36a, 36b, 36c and 36d is set smaller than the width "a" of the window opened to expose each of the parts of the upper surfaces of the inter-layer insulating film 32 outside the array of the patterns of the upper level interconnections 36a, 36b, 36c and 36d, the height of each of the wiring bumps 35a, 35b, 35c and 35d is automatically determined to be lower than the height of each of the cone bumps 33a, 33b. When the dimension of the spraying nozzle for spraying the nano-metallic particles is greater than the diameter of the window, the formed bump becomes isotropic. When the shape of the window is quadrangular, the bump becomes rectangular pyramidal, and when the shape of the window is circular, the bump becomes conical. The protrusions serving as the bumps are formed in each of the center of the windows.

Figure 10E:
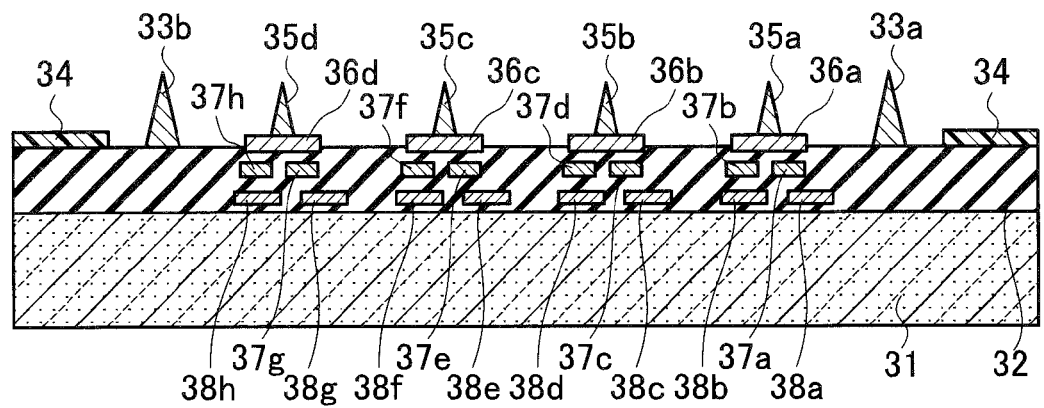
FIG. 10E is a subsequent cross sectional view in the process-flow of the method of manufacturing the upper chip adapted for the stacked device pertaining to the first embodiment, which explains a next step of the stage illustrated in FIG. 10D.

(e) After that, when the photo-resist film 62 is removed, the configuration of the upper chip UC, which has an array of the wiring bumps 35a, 35b, 35c and 35d made of Au or Au-alloy, and the cone bumps 33a, 33b made of Au or Au-alloy that are arranged in the areas outside the array of the wiring bumps 35a, 35b, 35c and 35d, is completed as illustrated in FIG. 10E.

As mentioned above, according to the method of manufacturing the stacked device pertaining to the first embodiment of the present invention, it is possible to achieve the stacked device in which at the position-aligning accuracy of 0.2 micrometer or less, the upper chip UC is positioned at and stacked on the lower chip LC, and each of the wiring lands 55a, 55b, 55c and 55d in the lower chip LC and each of the tips of the corresponding wiring bumps 35a, 35b, 35c and 35d in the upper chip UC are electrically connected to each other automatically and firmly by the thermal compressive jointing, and the upper chip UC is bonded onto the lower chip LC, in the simple working content.

Second Embodiment

Figure 14:
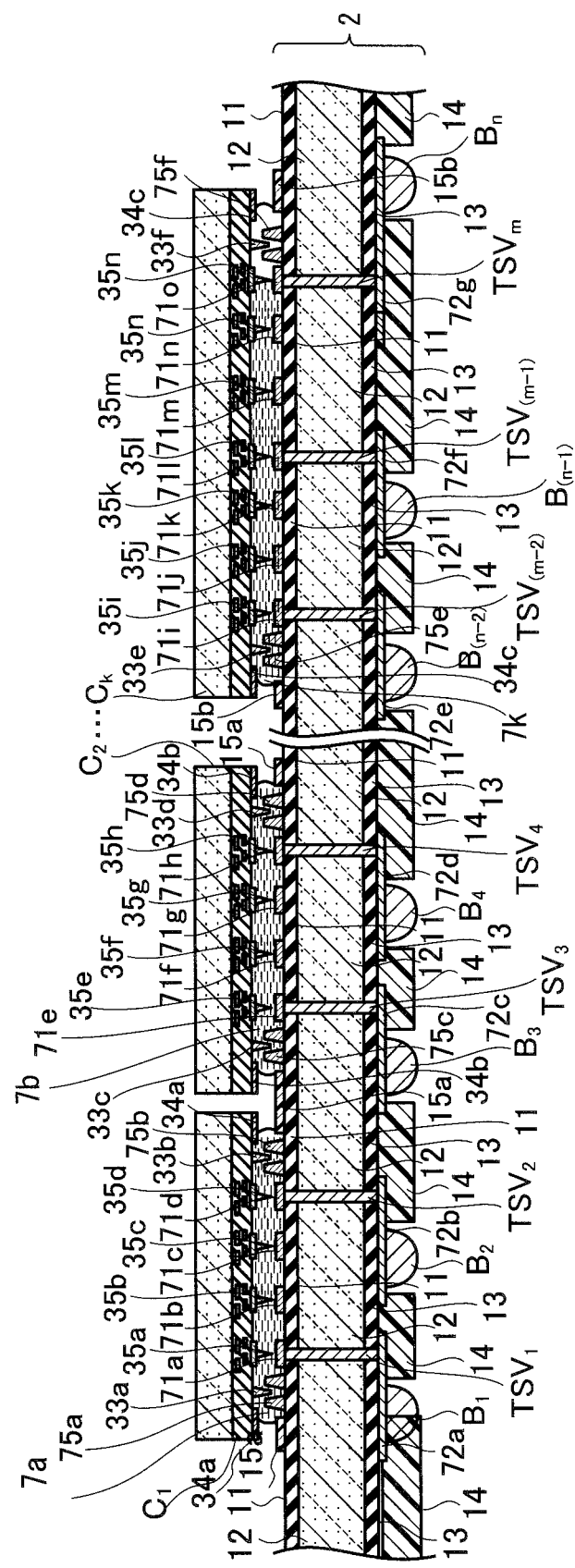
FIG. 14 is a schematic cross-sectional view that explains a rough outline of the main portion of a stacked device pertaining to a second embodiment of the present invention.

In the stacked device pertaining to the second embodiment of the present invention, as illustrated in FIG. 14, k pieces of semiconductor integrated circuit (IC) chips, namely, a first IC chip $C_1$, a second IC chip $C_2$, - - - , a k-th IC chip $C_k$ are mounted on an interposer 2 (when FIG. 14 is considered, "k" is a positive integer of three or more. However, generally, k=1 or 2 may be used). The interposer 2 includes a silicon substrate 12, a top-insulating film 11 that is formed on a top surface of this silicon substrate 12 and made of silicon oxide film and the like, and a bottom-insulating film 13 that is formed on a bottom surface of the silicon substrate 12 and made of silicon oxide film and the like. Then, on the upper plane of the top-insulating film 11, a plurality of wiring lands 71a to 71o are grouped and arrayed by considering the size of the IC chip. Ridged patterns 75a, 75b are arranged at positions outside the array of the wiring lands 71a, 71b, 71c and 71d of a first group. Ridged patterns 75c, 75d are arranged at positions outside the array of wiring lands 71e, 71f, 71g and 71h of a second group. Ridged patterns 75e, 75f are arranged at positions outside the array of wiring lands 71i, 71j, 71k, - - - , 71o of a k-th group. Each of the wall-block patterns 75a, 75b; 75c, 75d; 75e, 75f has the inclined planes similar to the wall-block patterns 53a, 53b pertaining to the first embodiment. Similarly to the configuration illustrated in FIG. 8, even in the stacked device pertaining to the second embodiment, a height of the wall-block patterns 75a, 75b; 75c, 75d; 75e, 75f measured from the reference plane of the interposer 2 is higher than a thickness of the wiring lands 71a to 71o measured from the same reference plane of the interposer 2.

Also, FIG. 14 exemplifies a configuration in which the wall-block patterns 75a, 75b are arranged at the positions outside the array of the wiring lands 71a, 71b, 71c and 71d of the first group, and the wall-block patterns 75c, 75d are arranged at the positions outside the array of the wiring lands 71e, 71f, 71g and 71h of the second group, and - - - , and the wall-block patterns 75e, 75f are arranged at the positions outside the array of the: wiring lands 71i, 71j, 71k, - - - , 71o of the k-th group. However, the stacked device pertaining to the second embodiment may be fabricated such that at least one of the wall-block patterns 75a, 75b exists in the inside of the array of the wiring lands 71a, 71b, 71c and 71d of the first group, and at least one of the wall-block patterns 75c, 75d exists in the inside of the array of the wiring lands 71e, 71f, 71g and 71h of the second group, and - - - , and at least one of the wall-block patterns 75e, 75f exists in the inside of the array of the wiring lands 71i, 71j, 71k, - - - , 71o of the k-th group. That is, the wall-block patterns 75a, 75b; 75c, 75d; 75e, 75f may be arranged at the positions, respectively, except the locations at which the wiring lands 71a to 71o are arrayed.

When the wiring lands 71a to 71o are made of the Au or Au-alloy that contains 80% or more of Au weight percent based on total alloy weight, the behavior of the wiring lands 71a to 71o are preferable with regard to the hardness and the contact resistance. Moreover, as illustrated in FIG. 14, a pattern of a hydrophobic film 15a that has the shape of a lens rim adapted for a pair of glasses is delineated selectively in areas. Here, an rectangular area in which wiring lands 71a, 71b, 71c and 71d and the wall-block patterns 75a, 75b of the first group are arranged is assigned as one of the rectangular lens-portions, and a rectangular area in which the wiring lands 71e, 71f, 71g and 71h and the wall-block patterns 75c, 75d of the second group are arranged is assigned as the other one of the rectangular lens-portions. Then the periphery of the above two rectangular areas, each of which is assigned one of the rectangular lens-portions, is surrounded by the hydrophobic film 15a in a rectangular shape so as to form a topology of the lens rim.

An area in which the wiring lands 71i, 71j, 71k, - - -, 71o of the k-th group and the wall-block patterns 75e, 75f are arranged is surrounded with a pattern of a rectangular frame-shaped hydrophobic film 15b. FIG. 14 shows a pattern in which the pattern of the hydrophobic film 15a and the pattern of the hydrophobic film 15b are independent of each other, for convenience. Actually, a ladder-shaped pattern may be used in which the pattern of the hydrophobic film 15a and the pattern of the hydrophobic film 15b are continuous.

On the lower plane of the bottom-insulating film 13, bottom surface wirings 72a, 72b, - - -, 72g are formed, and the bottom surface wiring 72a is electrically connected to an wiring land 71a on the top surface side of the interposer 2 through a through-silicon via $TSV_1$ that penetrates the top-insulating film 11, the silicon substrate 12 and the bottom-insulating film 13. Similarly, the bottom surface wiring 72b is electrically connected to an wiring land 71d on the top surface side of the interposer 2 through a through-silicon via $TSV_2$ that penetrates the top-insulating film 11, the silicon substrate 12 and the bottom-insulating film 13, and the bottom surface wiring 72c is electrically connected to an wiring land 71e on the top surface side of the interposer 2 through a through-silicon via $TSV_3$ that penetrates the top-insulating film 11, the silicon substrate 12 and the bottom-insulating film 13, and the bottom surface wiring 72d is electrically connected to an wiring land 71h on the top surface side of the interposer 2 through a through-silicon via $TSV_4$ that penetrates the top-insulating film 11, the silicon substrate 12 and the bottom-insulating film 13. Moreover, the bottom surface wiring 72e is electrically connected to an wiring land 71i on the top surface side of the interposer 2 through a through-silicon via $TSV_{(m-2)}$ that penetrates the top-insulating film 11, the silicon substrate 12 and the bottom-insulating film 13, and the bottom surface wiring 72f is electrically connected to the wiring land 71i on the top surface side of the interposer 2 through a through-silicon via $TSV_{(m-1)}$ that penetrates the top-insulating film 11, the silicon substrate 12 and the bottom-insulating film 13, and the bottom surface wiring 72g is electrically connected to an wiring land 71o on the top surface side of the interposer 2 through a through-silicon via $TSV_m$ that penetrates the top-insulating film 11, the silicon substrate 12 and the bottom-insulating film 13.

On the lower plane of the bottom-insulating film 13, a solder resist 14 is formed so as to bury a part of the bottom surface wirings 72a, 72b, - - -, 72g. In the pattern of the solder resist 14, windows are opened to expose the parts of the lower planes of the bottom surface wirings 72a, 72b, - - -, 72g, respectively. Through the windows of the solder resist 14, solder bumps $B_1$, $B_2$, - - -, $B_n$ are formed to electrically connect with the bottom surface wirings 72a, 72b, - - -, 72g, respectively.

As illustrated in FIG. 14, the first IC chip $C_1$ has wiring bumps 35a, 35b, 35c and 35d assigned correspondingly to the positions of the wiring lands 71a, 71b, 71c and 71d, respectively, and the cone bumps 33a, 33b assigned correspondingly to the positions of the wall-block patterns 75a, 75b, respectively. And, each of the tips of the cone bumps 33a, 33b is thinner than the chip side, and a height of the cone bumps 33a, 33b measured from the reference plane of the first IC chip $C_1$ is higher than a height of the wiring bumps 35a, 35b, 35c and 35d, measured from the reference plane of the first IC chip $C_1$. Then, a rectangular area, in which the wiring bumps 35a, 35b, 35c and 35d and the cone bumps 33a, 33b are arranged, is surrounded by a rectangular frame-shaped pattern of a hydrophobic film 34a that is formed outside the rectangular area.

Similarly, the second IC chip $C_2$ has wiring bumps 35e, 35f, 35g and 35h assigned correspondingly to the positions of the wiring lands 71e, 71f, 71g and 71h, respectively, and cone bumps 33c, 33d which are assigned correspondingly to the positions of the wall-block patterns 75c, 75d, respectively. And, each of the tips of the cone bumps 33c, 33d is thinner than the chip side of the cone bumps 33c, 33d, and a height of the cone bumps 33c, 33d measured from the reference plane of the chip is higher than a height of the wiring bumps 35e, 35f, 35g and 35h, measured from the reference plane of the second IC chip $C_2$. Then, similarly to the first IC chip $C_1$, a rectangular area in which the wiring bumps 35e, 35f, 35g and 35h and the cone bumps 33c, 33d are arranged is surrounded by a rectangular frame-shaped pattern of a hydrophobic film 34b that is formed outside the rectangular area.

Still similarly, the k-th IC chip $C_k$ has wiring bumps 35i, 35j, 35k, - - -, 35o assigned correspondingly to the positions of the wiring lands 71i, 71j, 71k, - - -, 71o, respectively, and cone bumps 33e, 33f which are assigned correspondingly to the positions of the wall-block patterns 75e, 75f, respectively. And, each of the tips of the cone bumps 33e, 33f is thinner than the chip side of the cone bumps 33e, 33f, and a height of the cone bumps 33e, 33f measured from the reference plane of the k-th IC chip $C_k$ is higher than a height of the wiring bumps 35i, 35j, 35k, - - -, 35o, measured from the reference plane of the k-th IC chip $C_k$. Then, similarly to the first IC chip $C_1$ and the second IC chip $C_2$, a rectangular area in which the wiring bumps 35i, 35j, 35k, - - -, 35o and the cone bumps 33e, 33f are arranged is surrounded by the rectangular frame-shaped pattern of the hydrophobic film 34a that is formed outside the rectangular area. When the wiring bumps 35a to 35o and the cone bumps 33a, 33b; 33c, 33d; 33e, 33f are made of the gold or gold-alloy that contains 80% or more of Au weight percent based on total alloy weight, the behavior of the wiring bumps 35a to 35o and the cone bumps 33a, 33b; 33c, 33d; 33e, 33f are preferable with regard to the hardness and the contact resistance.

Since the droplets of liquids 7a, 7b and 7c are selectively coated onto the inside of each of non-hydrophobic areas surrounded by the pattern of the hydrophobic film 15a and the pattern of the hydrophobic film 15b, as illustrated in FIG. 14, with the surface tensions of the liquids 7a, 7b and 7c, the wiring bumps 35a, 35b, 35c and 35d of the first IC chip $C_1$ are precisely aligned at the positions of the wiring lands 71a, 71b, 71c and 71d of the interposer 2, respectively, and the cone bumps 33a, 33b are precisely aligned at the positions of the wall-block patterns 75a, 75b of the interposer 2, respectively. Similarly, the wiring bumps 35e, 35f, 35g and 35h of the second IC chip $C_2$ are precisely aligned at the positions of the wiring lands 71e, 71f, 71g and 71h of the interposer 2, respectively, and the cone bumps 33c, 33d are precisely aligned at the positions of the wall-block patterns 75c, 75d of the interposer 2, respectively, and the wiring bumps 35i, 35j, 35k, - - -, 35o of the k-th IC chip $C_k$ are precisely aligned at the positions of the: wiring lands 71i, 71j, 71k, - - -, 71o of the interposer 2, respectively, and the cone bumps 33e, 33f are precisely aligned at the positions of the wall-block patterns 75e, 75f of the interposer 2, respectively. Since the process of pushing the first IC chip $C_1$, the second IC chip $C_2$, - - -, the k-th IC chip $C_k$ onto the interposer 2 are carried out while they are heated, the wiring bumps 35a, 35b, 35c and 35d of the first IC chip $C_1$ are thermo-compression bonded to the wiring lands 71a, 71b, 71c and 71d of the interposer 2, respectively, and the wiring bumps 35e, 35f, 35g and 35h of the second IC chip $C_2$ are thermo-compression bonded to the wiring lands 71e, 71f, 71g and 71h of the interposer 2, respectively, - - -, and the wiring bumps 35i, 35j, 35k, - - -, 35o of the k-th IC chip $C_k$ are thermo-compression bonded to the wiring lands 71i, 71j, 71k, - - -, 71o of the interposer 2, respectively.

As mentioned above, according to the stacked device pertaining to the second embodiment, while the position-aligning accuracy of 0.2 micrometer or less is achieved, the first IC chip $C_1$, the second IC chip $C_2$, - - -, the k-th IC chip $C_k$ can be easily bonded to the interposer 2. In addition, although the illustration is omitted, the wall-block patterns 75a, 75b; 75c, 75d; 75e, 75f of the interposer 2 are electrically connected to the electric wiring layers and the like formed on the top-insulating film 11 of the interposer 2, and the cone bumps 33a, 33b are electrically connected to any of the electrical wiring layers of the first IC chip $C_1$, and the cone bumps 33c, 33d are electrically connected to any of the electrical wiring layers of the second IC chip $C_2$, and the cone bumps 33e, 33f are electrically connected to any of the electrical wiring layers of the k-th IC chip $C_k$. Consequently, the physical contact between any of the cone bumps 33a, 33b; 33c, 33d; 33e, 33f and the corresponding wall-block patterns 75a, 75b; 75c, 75d; 75e, 75f can be used for the electrical connection. In this case, the whole of the wall-block patterns 75a, 75b; 75c, 75d; 75e, 75f may be made of electrically conductive materials, or the electrical wiring layer may be formed on the surface.

Third Embodiment

Figure 15:
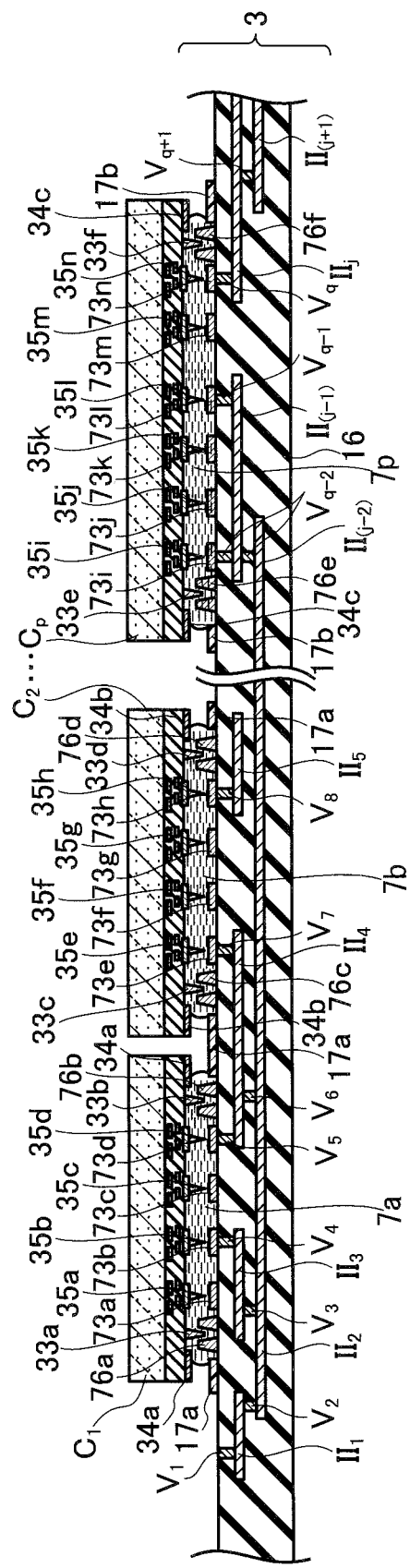
FIG. 15 is a schematic cross-sectional view that explains a rough outline of the main portion of a stacked device pertaining to a third embodiment of the present invention.

In the stacked device pertaining to the third embodiment of the present invention, as illustrated in FIG. 15, p peaces of semiconductor integrated circuit (IC) chips, namely, the first IC chip $C_1$, the second IC chip $C_2$, - - -, a p-th IC chip $C_k$ are mounted on an interposer 3 (In light of the disclosure illustrated in FIG. 15, although p is the positive integer of three or more, generally, p=1 or 2 may be used). The interposer 3 may be formed of a flexible resin substrate 16 as a base. Inside the resin substrate 16, lower-level inner wirings $II_2$, $II_{(j-2)}$ and $II_{(j+1)}$, and upper-level inner wirings $II_1$, $II_3$, $II_4$, $II_5$, $II_{(j-1)}$ and $II_j$ electrically connected through the resin substrate 16 on the lower-level inner wirings $II_2$, $II_{(j-2)}$ and $II_{(j+1)}$ are buried as illustrated in FIG. 15. Although the resin substrate 16 is represented as if it was a single layer substrate in a rough outlined simple representation illustrated in FIG. 15, the resin substrate 16 is actually the multilevel structure implemented by triple or quadruple-level insulating layers. Also, although FIG. 15 exemplifies the inner wiring structure implemented by double layers for simplification, a multilevel inner wiring structure, implemented by triple layers or more, may be employed on the basis of the design-based requirement of the interposer 3.

On the top surface of the interposer 3, as illustrated in FIG. 15, a plurality of wiring lands 73a to 73n are grouped and arrayed by considering the size of the IC chip. Ridged patterns 76a, 76b are arranged at positions outside the array of the wiring lands 73a, 73b, 73c and 73d of a first group, and wall-block patterns 76c, 76d are arranged at positions outside the array of wiring lands 73e, 73f, 73g and 73h of a second group, and - - - -, wall-block patterns 76e, 76f are arranged at positions outside the array of wiring lands 73i, 73j, 73k, - - -, 73n of a p-th group. Each of the wall-block patterns 76a, 76b; 76c, 76d; 76e, 76f has the inclined planes similar to the wall-block patterns 53a, 53b of the stacked device pertaining to the first embodiment. In addition, in the stacked device pertaining to the third embodiment, at least one of the wall-block patterns 76a, 76b may exist in the inside of the array of the wiring lands 73a, 73b, 73c and 73d of the first group, and at least one of the wall-block patterns 76c, 76d may exist in the inside of the array of the wiring lands 73e, 73f, 73g and 73h of the second group, and - - -, at least one of the wall-block patterns 76e, 76f may exist in the inside of the array of the wiring lands 73i, 73j, 73k and 73n of the p-th group. That is, the wall-block patterns 76a, 76b; 76c, 76d; 76e, 76f may be arranged at the positions, respectively, except the locations at which the wiring lands 73a to 73n are disposed.

Similarly to the explanations in the first and second embodiments, even in the stacked device pertaining to the third embodiment, a height of the wall-block patterns 76a, 76b; 76c, 76d; 76e, 76f measured from the reference plane of the interposer 3 is higher than a thickness of the wiring lands 73a to 73n, measured from the reference plane of the interposer 3. Each of the upper-level inner wirings $II_1$, $II_3$, $II_4$, $II_5$, $II_{(j-1)}$ and $II_j$ and each of the corresponding lower-level inner wirings $II_2$, $II_{(j-2)}$ and $II_{(j+1)}$ are connected to each other through via-plugs $V_2$, $V_3$, $V_6$, $V_{(q-2)}$ and $V_{(q+1)}$, respectively. And, the wiring land 73a formed on the top surface of the interposer 3 and the upper-level inner wiring $II_3$ are electrically connected to each other through the via-plug $V_4$. Similarly, the wiring land 73d and the upper-level inner wiring $II_4$ are electrically connected to each other through the via-plug $V_5$, and the wiring land 73e and the upper-level inner wiring $II_4$ are electrically connected to each other through the via-plug $V_7$, and the wiring land 73h and the upper-level inner wiring $II_5$ are electrically connected to each other through the via-plug $V_8$. Moreover, the wiring land 73i and the upper-level inner wiring $II_{(j-1)}$ are electrically connected to each other through the via-plug $V_{(q-2)}$, and the wiring land 73l and the upper-level inner wiring $II_{(j-1)}$ are electrically connected to each other through the via-plug $V_{(q-1)}$, and the wiring land 73n and the upper-level inner wiring $II_j$ are electrically connected to each other through the via-plug $V_q$.

Moreover, as illustrated in FIG. 15, a pattern of a hydrophobic film 17a that has a shape of a lens rim of a pair of glasses is delineated. Here, a rectangular area, where the wiring lands 73a, 73b, 73c and 73d and the wall-block patterns 76a, 76b of the first group are arranged, is assigned as one rectangular lens-portion of the pair of glasses, and a rectangular area, where the wiring lands 73e, 73f, 73g and 73h and the wall-block patterns 76c, 76d of the second group are arranged, is assigned as the other rectangular lens-portion of the pair of glasses. The periphery of the rectangular areas is surrounded by the pattern of a hydrophobic film 17a in a double rectangular shape so as to implement the topology of the lens rim of the pair of glasses.

An area in which the wiring lands 73i, 73j, 73k, - - -, 73n and the wall-block patterns 76e, 76f of the p-th group are arranged is surrounded by a pattern of a rectangular frame-shaped hydrophobic film 17b. Although FIG. 15 shows a pattern in which the pattern of the hydrophobic film 17a and the pattern of the hydrophobic film 17b are independent of each other, for convenience, a ladder-shaped pattern may be used in which the pattern of the hydrophobic film 17a and the pattern of the hydrophobic film 17b are continuous.

As illustrated in FIG. 15, the first IC chip $C_1$ has wiring bumps 35a, 35b, 35c and 35d assigned correspondingly to the positions of the wiring lands 73a, 73b, 73c and 73d, respectively, and cone bumps 33a, 33b which are assigned correspondingly to the positions of the wall-block patterns 76a, 76b, respectively. And, each of the tips of the cone bumps 33a, 33b is thinner than the chip side of the cone bumps 33a, 33b, and the height of the cone bumps 33a, 33b measured from the reference plane of the first IC chip $C_1$ is higher than the height of the wiring bumps 35a, 35b, 35c and 35d measured from the reference plane of the first IC chip $C_1$. Then, a rectangular area in which the wiring bumps 35a, 35b, 35c and 35d and the cone bumps 33a, 33b are arranged is surrounded by the rectangular frame-shaped pattern of the hydrophobic film 34a that is formed outside the rectangular area.

Similarly, the second IC chip $C_2$ has wiring bumps 35e, 35f, 35g and 35h assigned correspondingly to the positions of the wiring lands 73e, 73f, 73g and 73h, respectively, and cone bumps 33c, 33d which are assigned correspondingly to the positions of the wall-block patterns 76c, 76d, respectively. And, each of the tips of the cone bumps 33c, 33d is thinner than the chip side of the cone bumps 33c, 33d, and the height of the cone bumps 33c, 33d measured from the reference plane of the second IC chip $C_2$ is higher than the height of the wiring bumps 35e, 35f, 35g and 35h, measured from the reference plane of the second IC chip $C_2$ Then, similarly to the first IC chip $C_1$, a rectangular area in which the wiring bumps 35e, 35f, 35g and 35h and the cone bumps 33c, 33d are arranged is surrounded by the rectangular frame-shaped pattern of the hydrophobic film 34b that is formed outside the rectangular area.

Still similarly, the p-th IC chip $C_p$ has wiring bumps 35i, 35j, 35k, - - - , 35n assigned correspondingly to the positions of the wiring lands 73i, 73j, 73k, - - - , 73n, respectively, and cone bumps 33e, 33f which are assigned correspondingly to the positions of the wall-block patterns 76e, 76f, respectively. And, each of the tips of the cone bumps 33e, 33f is thinner than the chip side of the cone bumps 33e, 33f, and the height of the cone bumps 33e, 33f measured from the reference plane of the p-th IC chip $C_p$ is higher than the height of the wiring bumps 35i, 35j, 35k, - - - , 35n, measured from the reference plane of the p-th IC chip $C_p$. Then, similarly to the first IC chip $C_1$ and the second IC chip $C_2$, a rectangular area in which the wiring bumps 35i, 35j, 35k, - - - , 35n and the cone bumps 33e, 33f are arranged is surrounded by the rectangular frame-shaped pattern of the hydrophobic film 34a that is formed outside the rectangular area. When the wiring bumps 35a to 35n, the cone bumps 33a, 33b; 33c, 33d; 33e, 33f and the wiring lands 73a to 73n are made of the gold or gold-alloy that contains 80% or more of Au weight percent based on total alloy weight, the behavior the wiring bumps 35a to 35n, the cone bumps 33a, 33b; 33c, 33d; 33e, 33f and the wiring lands 73a to 73n are preferable with regard to the hardness and the contact resistance.

Since the droplets of the liquids 7a, 7b and 7c are selectively coated onto the inside of each of the non-hydrophobic areas surrounded by the pattern of the hydrophobic film 17a and the pattern of the hydrophobic film 17b, as illustrated in FIG. 15, with the surface tensions of the liquids 7a, 7b and 7c, the wiring bumps 35a, 35b, 35c and 35d of the first IC chip $C_1$ are precisely aligned at the positions of the wiring lands 73a, 73b, 73c and 73d of the interposer 3, respectively, and the cone bumps 33a, 33b are precisely aligned at the positions of the wall-block patterns 76a, 76b of the interposer 3, respectively. Similarly, the wiring bumps 35e, 35f, 35g and 35h of the second IC chip $C_2$ are precisely aligned at the positions of the wiring lands 73e, 73f, 73g and 73h of the interposer 3, respectively, and the cone bumps 33c, 33d are precisely aligned at the positions of the wall-block patterns 76c, 76d of the interposer 3, respectively, and the wiring bumps 35i, 35j, 35k, - - - , 35n of the p-th IC chip $C_p$ are precisely aligned at the positions of the wiring lands 73i, 73j, 73k, - - - , 73n of the interposer 3, respectively, and the cone bumps 33e, 33f are precisely aligned at the positions of the wall-block patterns 76e, 76f of the interposer 3, respectively. Since the process of pushing the first IC chip $C_1$, the second IC chip $C_2$, - - - , the p-th IC chip $C_p$ onto the interposer 3 are carried out while they are heated, the wiring bumps 35a, 35b, 35c and 35d of the first IC chip $C_1$ are thermo-compression bonded to the wiring lands 73a, 73b, 73c and 73d of the interposer 3, respectively, and the wiring bumps 35e, 35f, 35g and 35h of the second IC chip $C_2$ are thermo-compression bonded to the wiring lands 73e, 73f, 73g and 73h of the interposer 3, respectively, - - - , and the wiring bumps 35i, 35j, 35k, - - - , 35n of the p-th IC chip $C_p$ are thermo-compression bonded to the wiring lands 73i, 73j, 73k, - - - , 73n of the interposer 3, respectively.

As mentioned above, according to the stacked device pertaining to the third embodiment, while the position-aligning accuracy of 0.2 micrometer or less is achieved, the first IC chip $C_1$, the second IC chip $C_2$, - - - , the p-th IC chip $C_p$ can be easily bonded to the interposer 3. In addition, although the illustration is omitted, the wall-block patterns 76a, 76b; 76c, 76d; 76e, 76f of the interposer 3 are electrically connected to the upper electric wiring or lower inner wiring and the like of the interposer 3, and the cone bumps 33a, 33b are electrically connected to any of the electrical wiring layers of the first IC chip $C_1$, and the cone bumps 33c, 33d are electrically connected to any of the electrical wiring layers of the second IC chip $C_2$, and the cone bumps 33e, 33f are electrically connected to any of the electrical wiring layers of the p-th IC chip $C_p$. Consequently, the feasibility that the physical contact between any of the cone bumps 33a, 33b; 33c, 33d; 33e, 33f and the corresponding wall-block patterns 76a, 76b; 76c, 76d; 76e, 76f can be used for the electrical connection is similar to the stacked device pertaining to the first and second embodiments.

Other Embodiments

As mentioned above, the present invention has been described by using the first to third embodiments. However, the discussions in the text and drawings that implement a part of this disclosure should not be understood to limit the present invention. From this disclosure, various modifications, implementations and operational techniques would be evident for one skilled in the art.

Figure 12A:
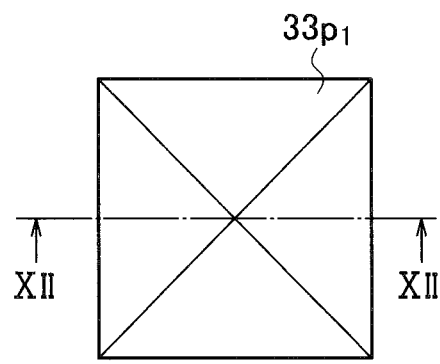
FIG. 12A is a schematic plan view that explains an example of a structure of a cone bump adapted for the stacked device pertaining to the first embodiment.
Figure 12B:
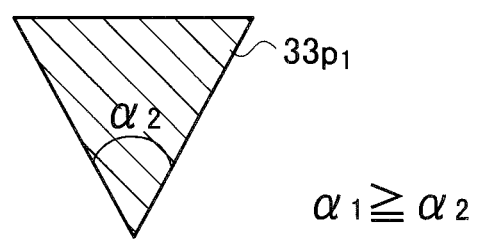
FIG. 12B is a cross-sectional view taken from an XII-XII direction in FIG. 12A.

For example, the explanations of the first to third embodiments as mentioned already are described about the engagement between the cone bump and the wall-block pattern, for the case in which as illustrated in FIGS. 11A and 11B, on the center of the wall-block pattern 53p having the shape of the truncated pyramid (the shape of the pyramidal frustum), the pyramidal concave of the apex angle $\alpha_1$ defined in the cross-section viewed from the XI-XI direction in FIG. 11A is formed, and the value of the apex angle $\alpha_1$ is set greater than the apex angle $\alpha_2$ ($\alpha_1 \geq \alpha_2$) defined in the cross-section viewed from the XII-XII direction in FIG. 12A, with regard to the pyramidal cone bump $33p_1$ illustrated in FIG. 12B. However, as illustrated in FIGS. 16A and 16B, a truncated pyramidal wall-block pattern 53q is formed, and on the center of the wall-block pattern 53q, a truncated pyramidal concave of a slant angle $\beta_1/2$ of a side wall with respect to a perpendicular direction defined in the cross-section viewed from the XVI-XVI direction in FIG. 16A is formed, and in a case that the bottom of the concave is flat, even when a value of the slant angle $\beta_1/2$ of the side wall is set smaller than an apex angle $\beta_2$ ($\beta_1 \leq \beta_2$) defined in the cross-section viewed from the XVII-XVII direction in FIG. 17A, with regard to a pyramidal cone bump $33q_1$ illustrated in FIG. 17B, it is possible to carry out the precise alignment through the self-alignment.

In the case of the relation of the apex angle of ($\beta_1 \le \beta_2$) illustrated in FIGS. 16A, 16B, 17A and 17B, the apex of the cone bump $33q_1$ does not arrive at the bottom of the truncated pyramid that implements the concave, which is cut in the center of the wall-block pattern 53$q$. However, four inclined planes of the cone bump $33q_1$ are engaged with four sides serving as the inner edges of the opening in the top base of t the wall-block pattern 53$q$, respectively, while they are in contact with each other at the same time. Consequently, the self-alignment is carried out such that the center of the cone bump $33q_1$ and the center of the wall-block pattern 53$q$ are aligned. Then, this self-alignment enables the precise alignment of the accuracy of 0.2 micrometer or less.

Figure 16A:
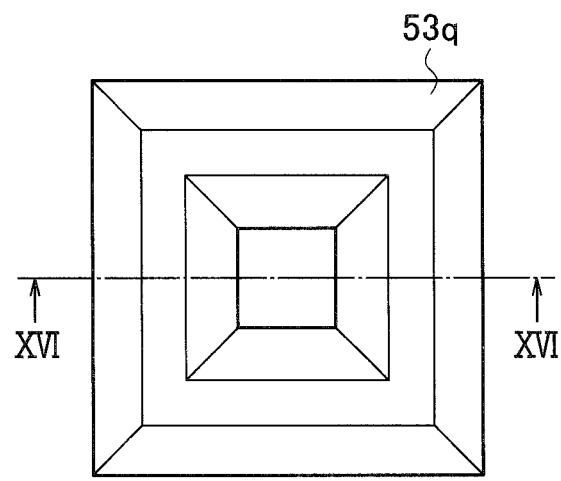
FIG. 16A is a schematic plan view that explains an example of a structure of a wall-block pattern used in a stacked device pertaining to another embodiment.
Figure 16B:
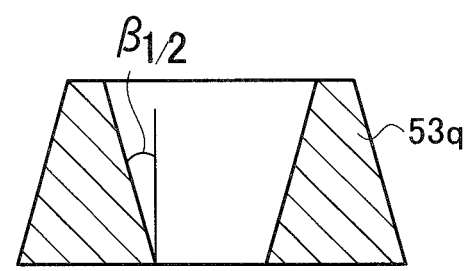
FIG. 16B is a cross-sectional view taken from an XVI-XVI direction in FIG. 16A.
Figure 18A:
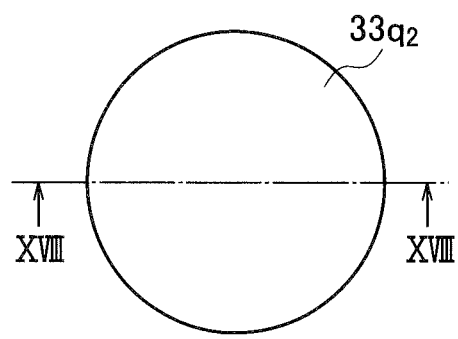
FIG. 18A is a schematic plan view that explains another example of the structure of the cone bump used correspondingly to the wall-block pattern illustrated in FIG. 16.
Figure 18B:
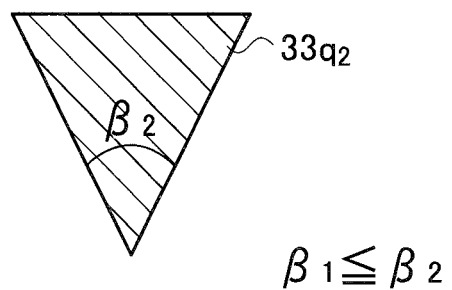
FIG. 18B is a cross-sectional view taken from an XVIII-XVIII direction in FIG. 18A.

Similarly, even in a case that the value of the slant angle $\beta_1/2$ of the side wall of the wall-block pattern 53$q$ illustrated in FIGS. 16A and 16B is set smaller than the apex angle $\beta_2$ ($\beta_1 \le \beta_2$) defined in the cross-section viewed from the XIII-XIII direction in FIG. 18A, with regard to a conical cone bump $33q_2$ illustrated in FIG. 18B, the apex of the cone bump $33q_2$ does not arrive at the bottom of the truncated pyramid that implements the concave, which is cut in the center of the wall-block pattern 53$q$. However, four points on a circle circumference of the cone bump $33q_2$ are engaged with the four sides serving as the inner edges of the opening in the top base of the wall-block pattern 53$q$, respectively, while they are in contact at the same time. Thus, the precise alignment of the accuracy of 0.2 micrometer or less can be achieved by the self-alignment.

Moreover, even in a case of an L-shaped wall-block pattern 53$r$ as illustrated in FIGS. 19($a$) and 19($b$), in which the truncated pyramidal shape illustrated in FIGS. 16A and 16B is diagonally divided, in such a way that a part of inclined planes of a pyramidal or conical cone bump 33$r$ are engaged with two inner sides, which is defined at the top end of the wall-block pattern 53$r$, respectively, while they are in contact at the same time, the precise alignment can be achieved by the self-alignment. As illustrated in FIGS. 19($a$) and 19($b$), in the case of the L-shaped wall-block pattern 53$r$, the L-shaped wall-block patterns are arranged at four or more locations in a non-hydrophobic area, such as four corners of the area inside the rectangular frame-shaped pattern of the hydrophobic film, and the like, respectively, and an alignment accuracy of the accuracy of 0.2 micrometer or less can be achieved.

Figure 20:
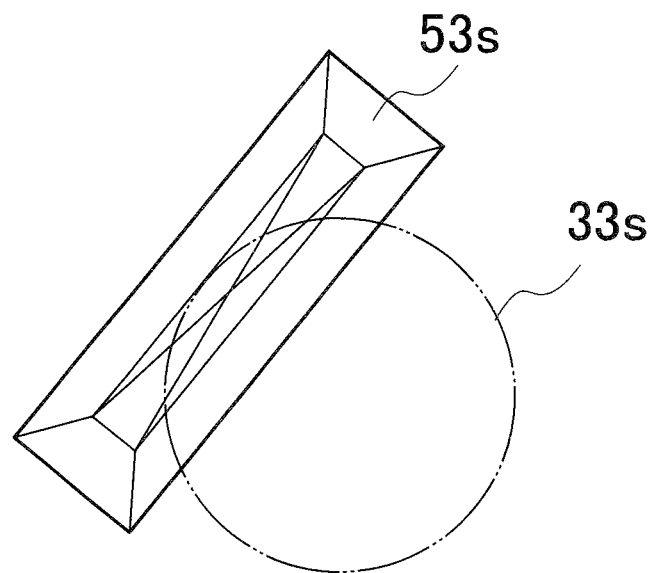
FIG. 20 is a schematic plan view that explains still another example of the structure of the wall-block pattern.

Moreover, even with a truncated pyramidal wall-block pattern 53$s$, which has a linear top base in a plan view illustrated in FIG. 20, the topology of which corresponds to a case that the L-shaped wall-block pattern 53$r$ illustrated in FIGS. 19($a$) and 19($b$) is conceptually extended and generalized, the self-alignment can be carried such that a part of a inclined plane of a pyramidal or conical cone bump 33$s$ is in contact with a side, defined at the top end of the wall-block pattern 53$s$. In this case, the truncated pyramidal wall-block patterns 53$r$, having the linear top base in the plan view, are arranged at the four or more locations, respectively, in the non-hydrophobic area, which is defined in the inside of the rectangular frame-shaped pattern of the hydrophobic film. Consequently, because at least one inclined plane of the pyramidal cone bump 33$s$ or at least one point on circle circumference of the conical cone bump 33$s$ can be brought into contact with the L-shaped wall-block pattern 53$r$, by providing simultaneous contact at four or more locations, a precise alignment can be achieved by the self-alignment. That is, even in the case of the truncated pyramidal wall-block pattern 53$s$ as illustrated in FIG. 20, an alignment accuracy of the accuracy of 0.2 micrometer or less can be achieved.

Figure 21:
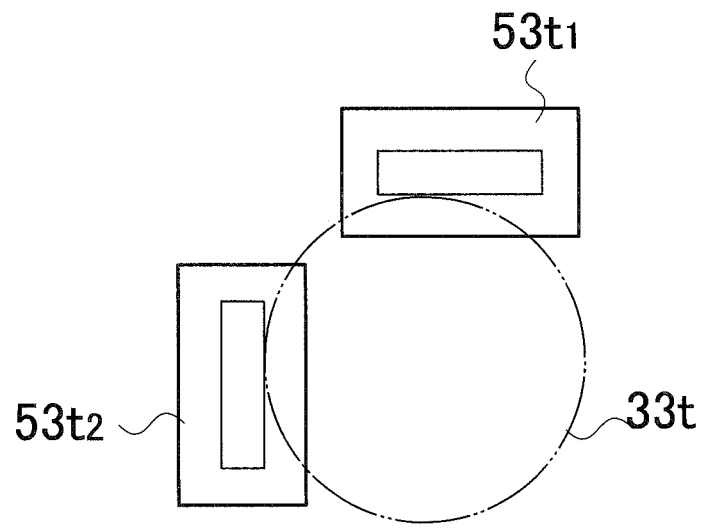
FIG. 21 is a schematic plan view that explains still another example of the structure of the wall-block pattern.

As another example of a topology, in which the L-shaped wall-block pattern 53$r$ illustrated in FIGS. 19($a$) and 19($b$) is conceptually extended and generalized, it is allowable to use truncated pyramidal wall-block patterns $53t_1$, $53t_2$ that exhibit a couple of linear patterns, each of the longitudinal directions of the linear patterns is orthogonal to each other in a plan view, as illustrated in FIG. 21. At four or more locations in the non-hydrophobic area, which is defined in the inside of the pattern of the hydrophobic film, the two wall-block patterns $53t_1$, $53t_2$ are allocated as a plurality of pairs. Each of the linear patterns $53t_1$, $53t_2$ in each of the pairs is disposed at a distance shorter than the dimension of the thick portion on the chip side of a cone bump 33$t$, so that the linear patterns $53t_1$, $53t_2$ are arranged close to each other in each of the pairs. Thus, two inclined planes of each of the pyramidal cone bumps 33$t$ or two points on the circular circumference of each of the conical cone bumps 33$t$ are brought into contact simultaneously, the two contact points are defined at four or more locations, respectively, so that a precise alignment can be carried out by the self-alignment. That is, even in the case of the topology implemented by a pair of truncated pyramidal wall-block patterns $53t_1$, $53t_2$ illustrated in FIG. 21, each of the wall-block patterns $53t_1$, $53t_2$ is arranged close to each other in each of the pairs, by disposing a plurality of pairs at four or more locations, respectively, an alignment accuracy of the accuracy of 0.2 micrometer or less can be achieved.

Figure 22:
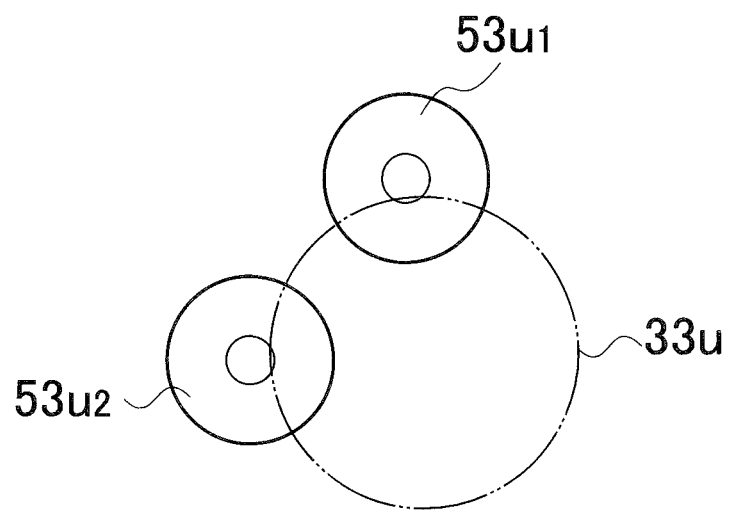
FIG. 22 is a schematic plan view that explains still another example of the structure of the wall-block pattern.

As still another topological example, in which the above topology implemented by the pair of wall-block patterns $53t_1$, $53t_2$ illustrated in FIG. 21 is conceptually extended and generalized, it is possible to achieve the effectiveness equivalent to the above topology illustrated in FIG. 21, even if two truncated conical wall-block patterns $53u_1$, $53u_2$ are allocated as a pair, in which each of the wall-block patterns $53u_1$, $53u_2$ is arranged close to each other, as shown FIG. 22. In the topology illustrated in FIG. 22, the two truncated conical wall-block patterns $53u_1$, $53u_2$ that are arranged close to each other at a distance shorter than the dimension of the thick portion on the chip side of the cone bump 33$u$ are allocated as a pair, and a plurality of pairs are arranged at the four or more locations, respectively, in the non-hydrophobic area, which is defined in the inside of the pattern of the hydrophobic film. Even by the topology illustrated in FIG. 22, the precise alignment can be achieved by the self-alignment, because two inclined planes or two points on the circular circumference of the cone bump 33 are brought into contact simultaneously, the two contact points are defined at four or more locations, respectively. That is, even in the case of the two truncated conical wall-block patterns $53u_1$, $53u_2$ that are arranged close to each other as illustrated in FIG. 21, an alignment accuracy of the accuracy of 0.2 micrometer or less can be achieved because the pairs are arranged at the four or more locations, respectively.

In this way, the present invention naturally includes various embodiments that are not described hereinabove. Thus, the technical scope of the present invention should be determined only by the subject-matter-to-define-the-invention according to the disclosure of claims, which are reasonable from the above descriptions.

What is claimed is:
1. A stacked device comprising:
a lower chip including a plurality of wiring lands dedicated to electrical connection positioned at a plurality of first lower chip positions and a plurality of wall-block patterns designed for position alignment positioned at a plurality of second lower chip positions, wherein, the plurality of second lower chip positions of the wall-block patterns are allocated to positions different from the plurality of first lower chip positions of the wiring lands, and wherein, each of the wall-block patterns has one or more inner planes, configured to define a closed concave side wall surrounding a bottom plane of the wall-block pattern, a height of each of the wall-block patterns measured from a reference plane of an array of the plurality of the wiring lands being equal to or greater than the wiring lands; and an upper chip including a plurality of wiring cone bumps corresponding to the plurality of first lower chip positions of the wiring lands, each of the wiring cone bumps having a deformable tip electrically connected to the wiring lands so as to achieve plane-to-plane contacts by compressed topology of the deformable tips through thermo-compression bonding, respectively, and a plurality of solid alignment cone bumps corresponding to the plurality of second lower chip positions of the wall-block patterns, each of the alignment cone bumps having a substantially undeformable tip defining an apex angle, respectively, so that each of the substantially undeformable tips contacts to a single contact point in the bottom plane, respectively, a position of the single contact point being guided by the concave side wall, such that contact between the alignment cone bumps and the concave side wall is minimized allowing one or more gaps between non-contact portion of the alignment cone bumps and other portions of the concave side wall.

2. The stacked device of claim 1, wherein the plurality of wall-block patterns are arranged at positions outside the array of the wiring lands, respectively.

3. The stacked device of claim 1, wherein at least one of the wall-block patterns are arranged at positions inside the array of the wiring lands, respectively.

4. The stacked device of claim 1, wherein each of the contacts between the plurality of wall-block patterns and the plurality of alignment cone bumps is further used as electrical connection.

5. The stacked device of claim 1, wherein the wiring lands, the wiring cone bumps and the alignment cone bumps are made from gold or gold-alloy that contains 80 weight percent of gold based on total alloy weight or more.

6. The stacked device of claim 1, wherein a first hydrophobic film is delineated in a periphery of the lower chip configured to surround the array of the wiring lands and the wall-block patterns, and a second hydrophobic film is delineated in a periphery of the upper chip configured to surround an array of the plurality of the wiring cone bumps and the plurality of alignment cone bumps.

7. A stacked device comprising:
an interposer including a plurality of wiring lands dedicated to electrical connection positioned at a plurality of first interposer positions and a plurality of wall-block patterns designed for position alignment positioned at a plurality of second interposer positions, wherein, the plurality of second interposer positions of the wall-block patterns are allocated to positions different than the plurality of first interposer positions of the wiring lands, and wherein, each of the wall-block patterns has one or more inner planes, configured to define a closed concave side wall surrounding a bottom plane of the wall-block pattern, a height of each of the wall-block patterns measured from a reference plane of an array of the plurality of the wiring lands being equal or greater than the wiring lands; and an IC chip including a plurality of wiring cone bumps corresponding to the plurality of first interposer positions of the wiring lands, each of the wiring cone bumps having a deformable tip electrically connected to the wiring lands so as to achieve plane-to-plane contacts by compressed topology of the deformable tips through thermo-compression bonding, respectively, and a plurality of solid alignment cone bumps corresponding to the plurality of second interposer positions positions of the wall-block patterns, each of the alignment cone bumps having a substantially undeformable tip defining an apex angle respectively, so that each of the substantially undeformable tips contacts to a single contact point in the bottom plane, respectively, a position of the single contact point being guided by the concave side wall, such that contact between the alignment cone bumps and the concave side wall is minimized allowing one or more gaps between non-contact portion of the alignment cone bumps and other portions of the concave side wall.

8. The stacked device of claim 7, wherein the plurality of wall-block patterns are arranged at positions outside the array of the wiring lands, respectively.

9. The stacked device of claim 7, wherein at least one of the wall-block patterns are arranged at positions inside the array of the wiring lands, respectively.

10. The stacked device of claim 7, wherein each of the contacts between the plurality of wall-block patterns and the plurality of alignment cone bumps is further used as electrical connection.

11. The stacked device of claim 7, wherein the wiring lands, the wiring cone bumps and the alignment cone bumps are made from gold or gold-alloy that contains 80 weight percent of gold based on total alloy weight or more.

12. The stacked device of claim 7, wherein a first hydrophobic film is delineated in a periphery of the interposer configured to surround the arrays of the wiring lands and the wall-block patterns, and a second hydrophobic film is delineated in a periphery of the IC chip configured to surround an arrays of the plurality of the wiring cone bumps and the plurality of alignment cone bumps.

13. The stacked device of claim 7, wherein the arrays of the wiring lands and the wall-block patterns are grouped, and a first hydrophobic film is selectively delineated in a part of a surface of the interposer configured to surround each of the grouped arrays of the wiring lands and the wall-block patterns,
wherein a plurality of IC chips are mounted on the interposer, a plurality of second hydrophobic film are respectively formed in each of the IC chips, configured to surround the each of the arrays of the wiring cone bumps and the alignment cone bumps, respectively.

14. A stacked device comprising:
a lower chip including a plurality of wiring lands dedicated to electrical connection positioned at a plurality of first lower chip positions and a plurality of wall-block patterns designed for position alignment positioned at a plurality of second lower chip positions, wherein, the plurality of second lower chip positions of the wall-block patterns are allocated at to positions different than the plurality of first lower chip positions of the wiring lands, and wherein, each of the wall-block patterns has a inclined plane, a height of each of the wall-block patterns measured from a reference plane of an array of the plurality of the wiring lands being equal or greater than the wiring lands; and an upper chip including a plurality of wiring cone bumps corresponding to the plurality of first lower chip positions of the wiring lands, each of the wiring cone bumps having a deformable tip electrically connected to the wiring lands so as to achieve plane-to-plane contacts by compressed topology of the deformable tips through thermo-compression bonding, respectively, and a plurality of solid alignment cone bumps assigned correspondingly to the other positions of the wall-block patterns, each of the alignment cone bumps having a substantially undeformable tip defining an apex angle, respectively, a part of a cone plane in each of the alignment cone bumps is in contact with an upper edge of a concave defined by the wall-block patterns, such that each of the substantially undeformable tips do not contact the bottom plane of the wall-block pattern.

15. The stacked device of claim 14, wherein each of the alignment cone bumps having circular circumference, and the each of the circular circumference defines contact points at the upper edge.

16. A stacked device comprising:

an interposer including a plurality of wiring lands dedicated to electrical connection positioned at a plurality of first interposer positions and a plurality of wall-block patterns designed for position alignment positioned at a plurality of second interposer positions, wherein, the plurality of second interposer positions of the wall-block patterns are allocated to positions different than the plurality of first interposer positions of the wiring lands, and wherein, each of the wall-block patterns has a inclined plane, a height of each of the wall-block patterns measured from a reference plane of an array of the plurality of the wiring lands being equal or greater than the wiring lands; and an IC chip including a plurality of wiring cone bumps corresponding to the first interposer positions of the wiring lands each of the wiring cone bumps having a deformable tip electrically connected to the wiring lands so as to achieve plane-to-plane contacts by compressed topology of the deformable tips through thermo-compression bonding, respectively, and a plurality of alignment cone bumps assigned correspondingly to the positions of the wall-block patterns, each of the alignment cone bumps having a substantially undeformable tip defining an apex angle, respectively, a part of a cone plane in each of the alignment cone bumps is in contact with an upper edge of a concave defined by the wall-block patterns, such that each of the substantially undeformable tips does not contact the bottom plane of the wall-block pattern.

17. The stacked device of claim 16, wherein each of the alignment cone bumps having circular circumference, and the each of the circular circumference defines contact points at the upper edge.

* * * * *